(12) United States Patent
Cheng et al.

(10) Patent No.: US 12,256,548 B2
(45) Date of Patent: Mar. 18, 2025

(54) SEMICONDUCTOR DEVICE AND METHOD FOR MANUFACTURING THE SAME

(71) Applicant: MACRONIX INTERNATIONAL CO., LTD., Hsinchu (TW)

(72) Inventors: Chen-Yu Cheng, Hsinchu (TW); Tzung-Ting Han, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 418 days.

(21) Appl. No.: 17/748,121

(22) Filed: May 19, 2022

(65) Prior Publication Data

US 2023/0413548 A1 Dec. 21, 2023

(51) Int. Cl.
| | |
|---|---|
| H01L 27/11578 | (2017.01) |
| H01L 27/11565 | (2017.01) |
| H10B 43/10 | (2023.01) |
| H10B 43/20 | (2023.01) |
| H10B 43/27 | (2023.01) |
| H10B 43/40 | (2023.01) |
| H10B 43/50 | (2023.01) |

(52) U.S. Cl.
CPC ............. H10B 43/50 (2023.02); H10B 43/10 (2023.02); H10B 43/20 (2023.02); H10B 43/27 (2023.02); H10B 43/40 (2023.02)

(58) Field of Classification Search
CPC .................................................... H10B 43/50
See application file for complete search history.

(56) References Cited

U.S. PATENT DOCUMENTS

| | | | |
|---|---|---|---|
| 10,304,852 B1 * | 5/2019 | Cui | H10B 43/10 |
| 10,381,434 B1 * | 8/2019 | Pachamuthu | H10B 43/50 |
| 10,580,795 B1 * | 3/2020 | Luo | H01L 23/528 |
| 10,937,805 B1 | 3/2021 | Lee | |
| 11,257,843 B2 | 2/2022 | Choi | |
| 2017/0179154 A1 * | 6/2017 | Furihata | H10B 41/41 |
| 2017/0236746 A1 * | 8/2017 | Yu | G11C 16/24 |
| | | | 257/314 |
| 2017/0358593 A1 * | 12/2017 | Yu | H10B 43/27 |

(Continued)

FOREIGN PATENT DOCUMENTS

| | | |
|---|---|---|
| CN | 112349327 A | 2/2021 |
| CN | 112786566 A | 5/2021 |
| CN | 112786599 A | 5/2021 |

*Primary Examiner* — Victoria K. Hall
(74) *Attorney, Agent, or Firm* — McClure, Qualey & Rodack, LLP

(57) ABSTRACT

A semiconductor device includes a circuit board, a bottom plate, landing pads, a stack, support pillars, and memory pillars. The circuit board includes circuit structures and wires and has a peripheral area, an array area and a staircase area disposed between the peripheral area and the array area. The bottom plate is disposed on the circuit board, and the bottom plate includes a bottom conductive layer. The landing pads are embedded in at least a top portion of the bottom conductive layer and contact the bottom conductive layer in the staircase area. The stack is disposed on the bottom plate, and includes conductive layers and insulating layers alternately stacked along a first direction. The support pillars pass through the stack along the first direction and extend to the landing pads in the staircase area. The memory pillars pass through the stack along the first direction in the array area.

20 Claims, 30 Drawing Sheets

(56) References Cited

U.S. PATENT DOCUMENTS

| | | | |
|---|---|---|---|
| 2018/0040629 A1 | 2/2018 | Eom | |
| 2018/0323207 A1 | 11/2018 | Shim et al. | |
| 2019/0027488 A1* | 1/2019 | Kai | H01L 29/42376 |
| 2019/0139974 A1* | 5/2019 | Sugawara | H10B 43/27 |
| 2019/0229125 A1* | 7/2019 | Zhou | H10B 41/27 |
| 2019/0252403 A1* | 8/2019 | Kaminaga | H01L 23/5226 |
| 2019/0371807 A1* | 12/2019 | Nishikawa | H10B 41/10 |
| 2020/0035694 A1* | 1/2020 | Kaminaga | H10B 43/20 |
| 2020/0194450 A1* | 6/2020 | Pachamuthu | H01L 21/76877 |
| 2020/0251488 A1* | 8/2020 | Iwai | H10B 43/27 |
| 2021/0082865 A1* | 3/2021 | Baraskar | H01L 25/0657 |
| 2021/0134821 A1* | 5/2021 | Choi | H10B 41/27 |
| 2021/0134832 A1* | 5/2021 | Choi | H01L 21/76805 |
| 2021/0398997 A1* | 12/2021 | Luo | H10B 43/50 |
| 2022/0208600 A1* | 6/2022 | Tirukkonda | H01L 21/3081 |
| 2022/0254728 A1* | 8/2022 | Matsuno | H10B 43/27 |
| 2022/0352196 A1* | 11/2022 | Shimomura | H10B 41/35 |
| 2023/0016518 A1* | 1/2023 | Lien | G11C 16/16 |
| 2023/0309299 A1* | 9/2023 | Yang | H10B 41/10 |
| 2023/0345716 A1* | 10/2023 | Imai | H10B 43/35 |

\* cited by examiner

SEMICONDUCTOR DEVICE AND METHOD FOR MANUFACTURING THE SAME

BACKGROUND OF THE INVENTION

Field of the Invention

The invention relates in general to a semiconductor device and a method for manufacturing the same, and more particularly to a memory device and a method for manufacturing the same.

Description of the Related Art

Recently, as the demand for more superior memory devices has is gradually increased, various three-dimensional (3D) memory devices have been provided, such as a three-dimensional NAND (3D NAND) memory device having a multi-layered stack structure. Such three-dimensional memory devices can achieve higher storage capacity and have more excellent electrical properties, such as good data retention reliability and operation speed.

Conventional 3D NAND memory devices have relatively complex process steps. Therefore, how to simplify the manufacturing process of the 3D NAND memory device is still the focus of current research.

SUMMARY OF THE INVENTION

The invention is directed to a semiconductor device and a method for manufacturing the same. In particular, a semiconductor device with a simpler manufacturing process and a method for manufacturing the same are provided.

According to an embodiment of the present invention, semiconductor device is provided. The semiconductor device includes a circuit board, a bottom plate, a plurality of landing pads, a stack, a plurality of support pillars, and a plurality of memory pillars. The circuit board includes a plurality of circuit structures and a plurality of wires, the circuit structures are electrically connected to the corresponding wires, and the circuit board has a peripheral area, an array area and a staircase area disposed between the peripheral area and the array area. The bottom plate is disposed over the circuit board, and the bottom plate includes a bottom conductive layer. The landing pads are embedded in at least a top portion of the bottom conductive layer in the staircase area and contact the bottom conductive layer. The stack is disposed on the bottom plate, and the stack includes a plurality of conductive layers and a plurality of insulating layers alternately stacked along a first direction. The support pillars pass through the stack along the first direction in the staircase area and extend to the landing pads. The memory pillars pass through the stack along the first direction in the array area.

According to another embodiment of the present invention, a method for manufacturing a semiconductor device is provided. The method for manufacturing the semiconductor device includes the following steps, First, a circuit board is formed, the circuit board includes a plurality of circuit structures and a plurality of wires, the circuit structures are electrically connected to the corresponding wires, and the circuit board has a peripheral area, an array area and a staircase area disposed between the peripheral area and the array area. Next, a bottom plate is formed, the bottom plate is disposed over the circuit board, and the bottom plate includes a bottom conductive layer. A plurality of landing pads are formed, and the landing pads are embedded in at least a top portion of the bottom conductive layer and contact the bottom conductive layer in the staircase area. A stack is formed, the stack is disposed on the bottom plate, and the stack includes a plurality of conductive layers and a plurality of insulating layers alternately stacked along a first direction. A plurality of support pillars are formed, the support pillars pass through the stack along the first direction in the staircase area and extend to the landing pads. Thereafter, a plurality of memory pillars are formed, and the memory pillars pass through the stack in the first direction in the array area.

The above and other aspects of the invention will become better understood with regard to the following detailed description of the preferred but non-limiting embodiment(s). The following description is made with reference to the accompanying drawings.

DETAILED DESCRIPTION OF THE INVENTION

In the following detailed description, for purposes of explanation, various specific details are provided to provide an overall understanding of embodiments of the present disclosure. It should be understood, however, that one or more embodiments can be practiced without these specific details. In other instances, well-known structures and elements are shown in schematic diagrams in order to simplify the drawings.

Generally, a method for manufacturing a 3D NAND memory device includes a gate replacement process. Since multiple sacrificial layers are removed in the gate replacement process, it is necessary to provide support pillars in the staircase area to maintain the stability of the overall structure. In some comparative examples, the support pillars disposed in the staircase area are formed by an independent process, such as forming oxide pillars passing through a stacked structure. According to an embodiment of the present application, the formation of the support pillars can be integrated with the process of other components (for example, the formation of vertical contacts in the peripheral area), so compared with the comparative example in which the support pillars are formed by an independent process, the manufacturing method of the memory device of the present application can save time and cost.

FIGS. 1-17B illustrate a manufacturing flow chart of the semiconductor device 10 according to an embodiment of the present invention. FIGS. 1-7A, 8A, 9A, 10A, 11A, 12A, 13A, 14A, 15A, 16A and 17A correspond to a plane formed by a first direction (e.g., Z direction) and a second direction (e.g., X direction). FIGS. 7B, 8B, 9B, 10B, 11B, 12B, 13B, 14B, 15B, 16B and 17B correspond to the plane formed by the first direction (e.g., Z direction) and a third direction (e.g., Y direction). The first direction, the second direction and the third direction may be different from each other and intersected with each other, for example, perpendicular to each other.

Figure 1:
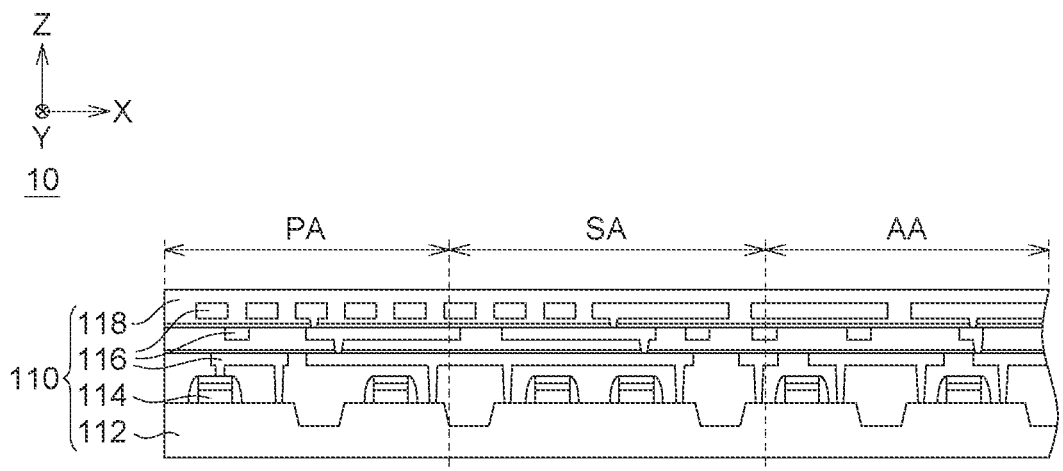
FIGS. 1-17B illustrate a manufacturing flow chart of a semiconductor device according to an embodiment of the present invention.

Referring to FIG. 1, FIG. 1 shows a schematic diagram of forming the circuit board 110. The steps of forming the circuit board 110 include providing a substrate 112, forming a plurality of circuit structures 114 and a plurality of wires 116 over the substrate 112, and forming an insulating material 118 covering the substrate 112, the circuit structures 114 and the wires 116. The wires 116 are respectively electrically connected to the corresponding circuit structures 114. The circuit structures 114 include a metal oxide semiconductor (CMOS). The insulating material 118 may include oxides. The circuit board 110 corresponds to a peripheral area PA, a staircase area SA, and an array area AA. The staircase area SA is disposed between the peripheral area PA and the array area AA.

Figure 2:
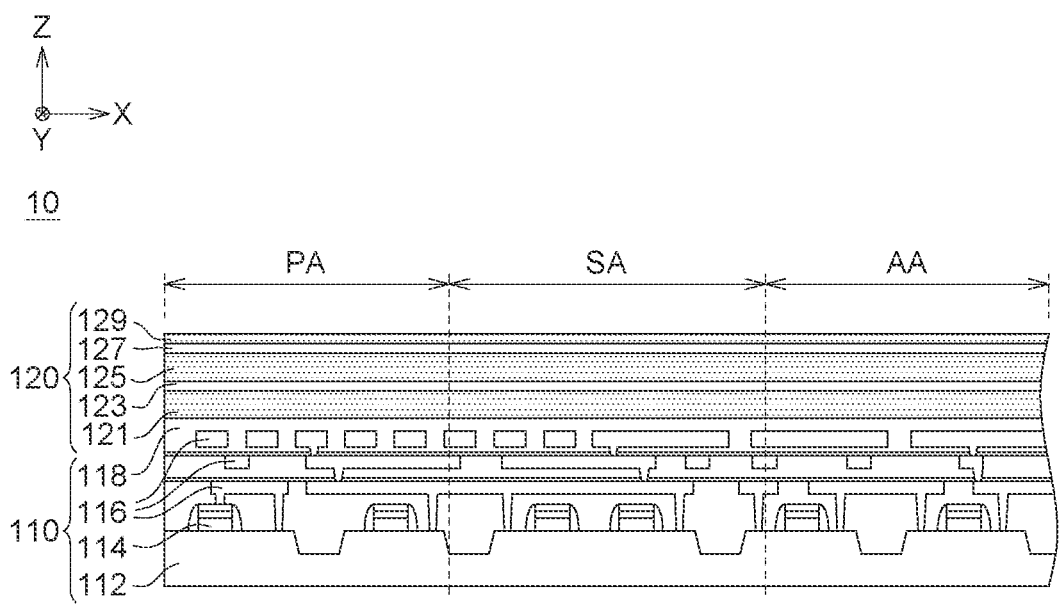

Referring to FIG. 2, FIG. 2 shows a schematic diagram of forming a bottom plate 120 on the circuit board 110. For example, a first conductive layer 121, a first insulating layer 123, a second conductive layer 125, a second insulating layer 127 and a third conductive layer 129 can be sequentially formed on the circuit board 110 in the first direction (e.g., Z direction) by deposition processes. That is, the bottom plate 120 may include a first conductive layer 121, a first insulating layer 123, a second conductive layer 125, a second insulating layer 127 and a third conductive layer 129. In the present embodiment, the materials of the first conductive layer 121, the second conductive layer 125 and the third conductive layer 129 may include polysilicon. The materials of the first insulating layer 123 and the second insulating layer 127 may include oxides. It should be understood that the present invention is not limited thereto.

Figure 3:
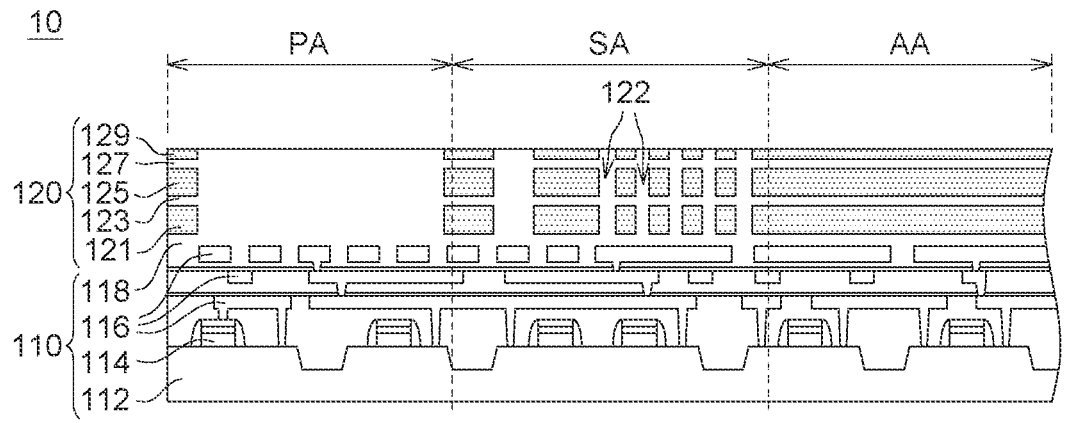

Referring to FIG. 3, the first conductive layer 121, the second conductive layer 125 and the third conductive layer 129 are removed at predetermined positions by an etching process to form a plurality of openings, and then an insulating material is filled in the openings, and a plurality of bottom support members 122 are formed in the staircase area SA. The bottom support members 122 may be composed of an insulating material, and the insulating material may include an oxide. In the staircase area SA, the bottom support members 122 pass through the first conductive layer 121, the second conductive layer 125 and the third conductive layer 129 in the first direction.

Figure 4:
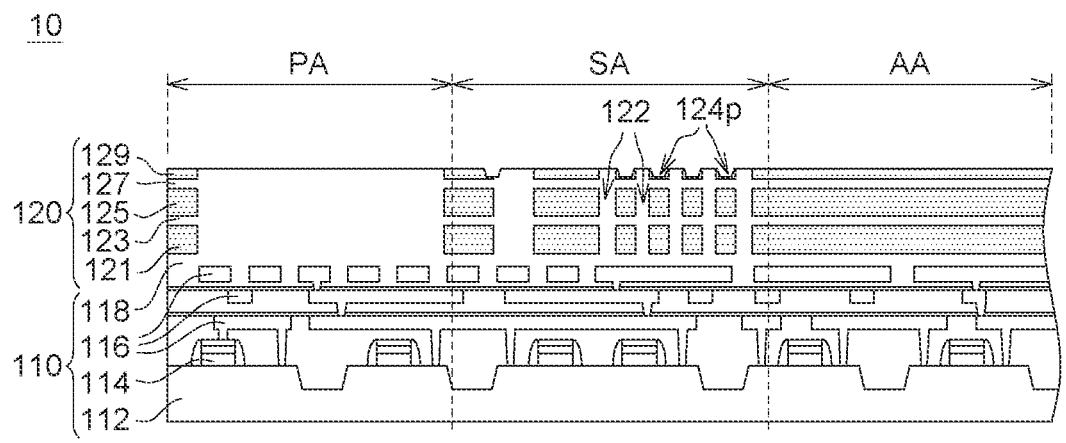

Referring to FIG. 4, a plurality of top openings 124p are formed in a top portion of the third conductive layer 129 in the staircase area SA. Each of the top openings 124p partially recesses into the third conductive layer 129 without exposing an upper surface of the second insulating layer 127. The top openings 124p are separated from each other, for example, adjacent top openings 124p may be separated from each other by at least a portion of the bottom support member 122.

Figure 5:
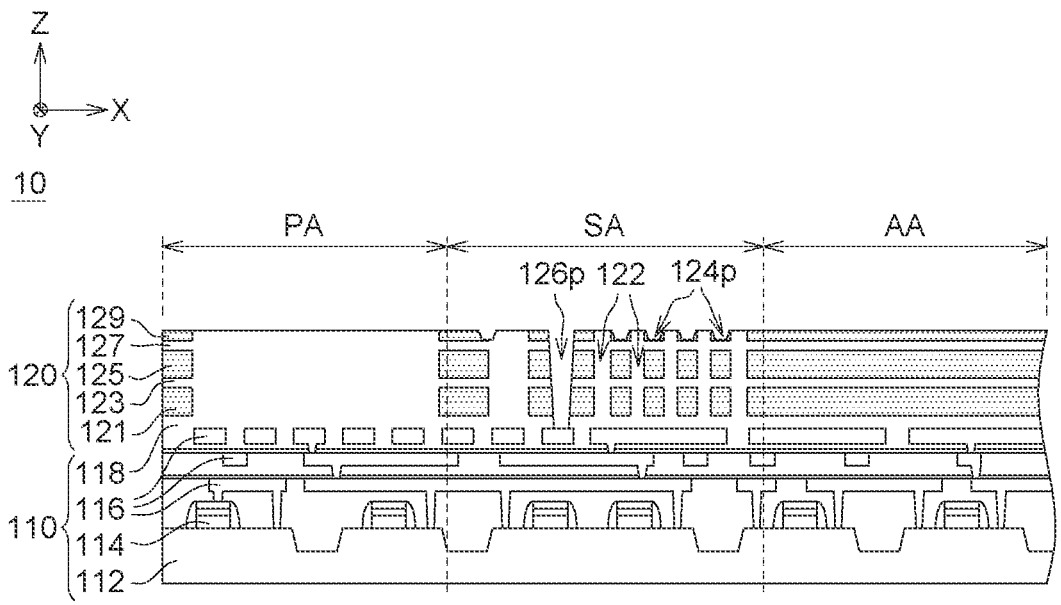

Referring to FIG. 5, through openings 126p passing through the first conductive layer 121, the first insulating layer 123, the second conductive layer 125, the second insulating layer 127 and the third conductive layer 129 (i.e., passing through the bottom plate 120) are formed in the staircase area SA. Each of the through openings 126p exposes an upper surface of the corresponding wire 116. The through openings 126p are separated from each other.

Figure 6:
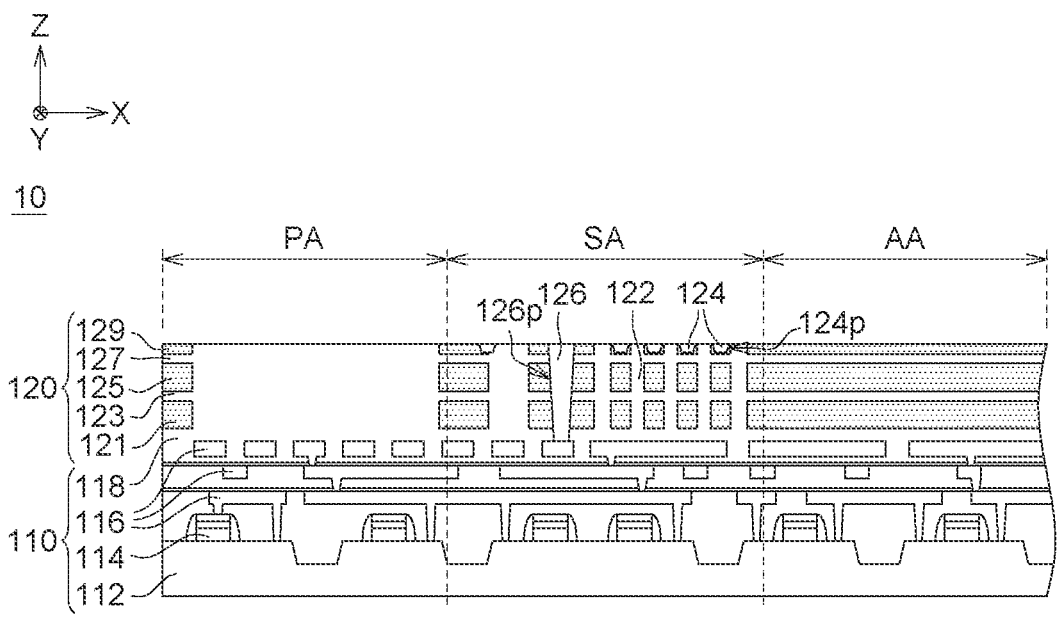

Referring to FIG. 6, a conductive material is filled into the top openings 124p and the through openings 126p by at least a deposition process and a planarization process to form a plurality of landing pads 124 and a plurality of discharge pillars 126, respectively, That is, the landing pads 124 are embedded in at least the top portion of the third conductive layer 129, and adjacent landing pads 124 are separated from each other by at least a portion of the bottom support member 122. A top surface of the landing pads 124 and a top surface of discharge pillars 126 are substantially coplanar. The discharge pillars 126 pass through the first conductive layer 121, the first insulating layer 123, the second conductive layer 125, the second insulating layer 127 and the third conductive layer 129 and are electrically connected to the corresponding wires 116. The discharge pillars 126 can be used to discharge the charges accumulated during the process. The landing pads 124 can provide a better etching selectivity in a subsequent etching process (details will be described later).

Figure 7A:
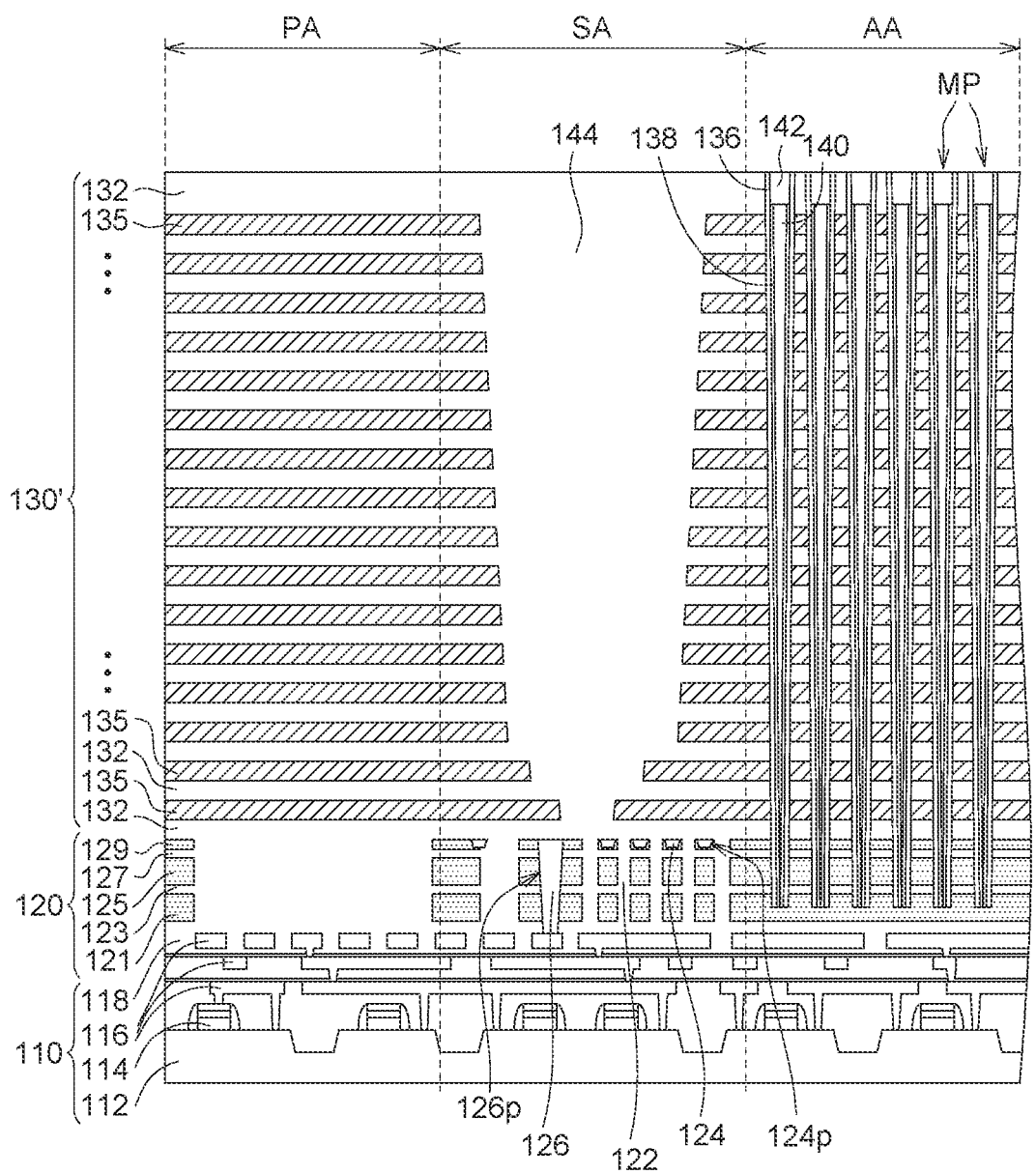
Figure 7B:
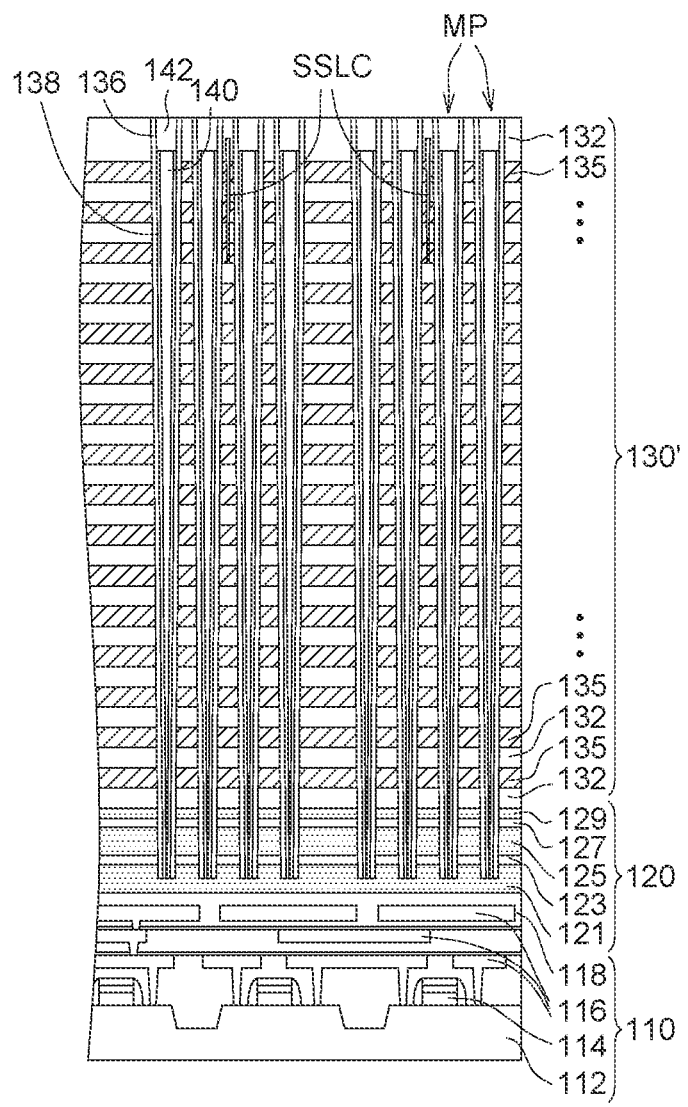

Referring to FIGS. 7A and 7B at the same time, a stacked structure 130' is formed over the bottom plate 120 (i.e., on the third conductive layer 129). The forming steps of the stacked structure 130' includes forming a plurality of insulating layers 132 and a plurality of sacrificial layers 135 alternately stacked in the first direction (i.e., Z direction) by deposition processes. The bottommost layer of the stacked structure 130' is, for example, an insulating layer 132. The material of the insulating layers 132 may include oxide, and the material of the sacrificial layers 135 may include nitride. After the stacked structure 130' formed, a plurality of memory pillars MP penetrating through the stacked structure 130' and through a portion of the first conductive layer 121 of the bottom plate 120 are formed in the array area AA. Each of the memory pillars MP may include a memory layer 136, a channel layer 138, an insulating pillar 140 and a bond pad 142. The channel layer 138 surrounds the insulating pillar 140 and covers a bottom surface of the insulating pillar 140. The memory layer 136 surrounds the channel layer 138 and covers a bottom surface of the channel layer 138. The bond pad 142 is disposed on the channel layer 138 and is in electrical contact with the channel layer 138. After the memory pillars MP formed, a plurality of top isolating members SSLC extending along the second direction (e.g., X direction) are formed. The top isolating members SSLC pass through a top portion of the stacked structure 130' along a first direction (e.g., Z direction). After the top isolating members SSLC formed, the sacrificial layers 135 of the staircase area SA is patterned to make the sacrificial layers 135 of the staircase area SA into a stepped structure to expose predetermined positions of landing regions of the word lines. After that, an insulating material 144 is covered on the stepped structure formed by the sacrificial layers 135.

In one embodiment, the material of the memory layer 136 may include a tunneling layer, a charge trapping layer, and a blocking layer. The tunneling layer may comprise silicon oxide, or a combination of silicon oxide/silicon nitride (e.g., Oxide/Nitride/Oxide or ONO). The charge trapping layer may include silicon nitride (SiN) or other materials capable of trapping charges. The blocking layer may include silicon oxide, aluminum oxide, and/or combinations of these materials. The material of the channel layer 138 and the bond pads 142 may include polysilicon. Materials of the insulating pillars 140 and the top isolating members SSLC may include oxide.

Figure 8A:
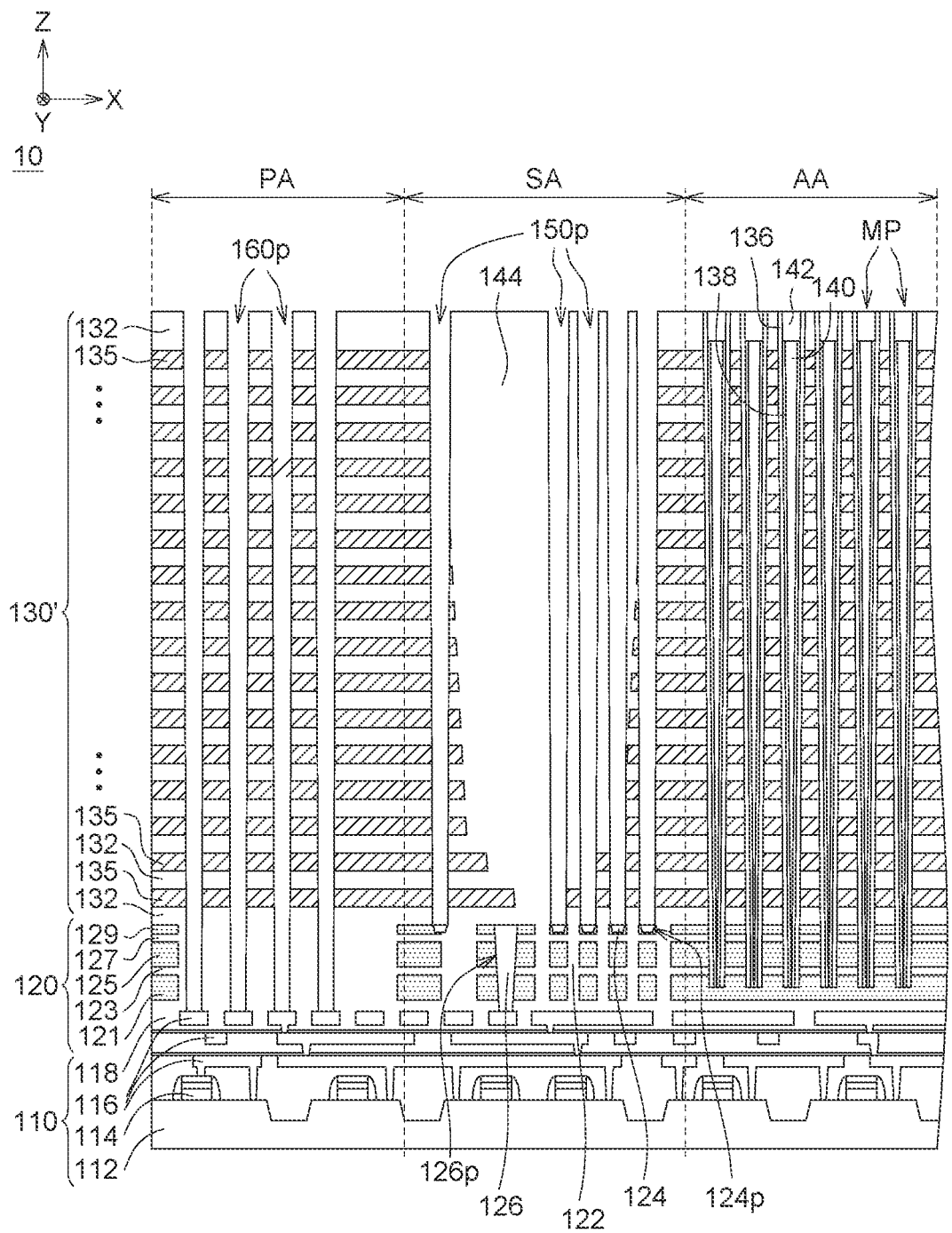
Figure 8B:
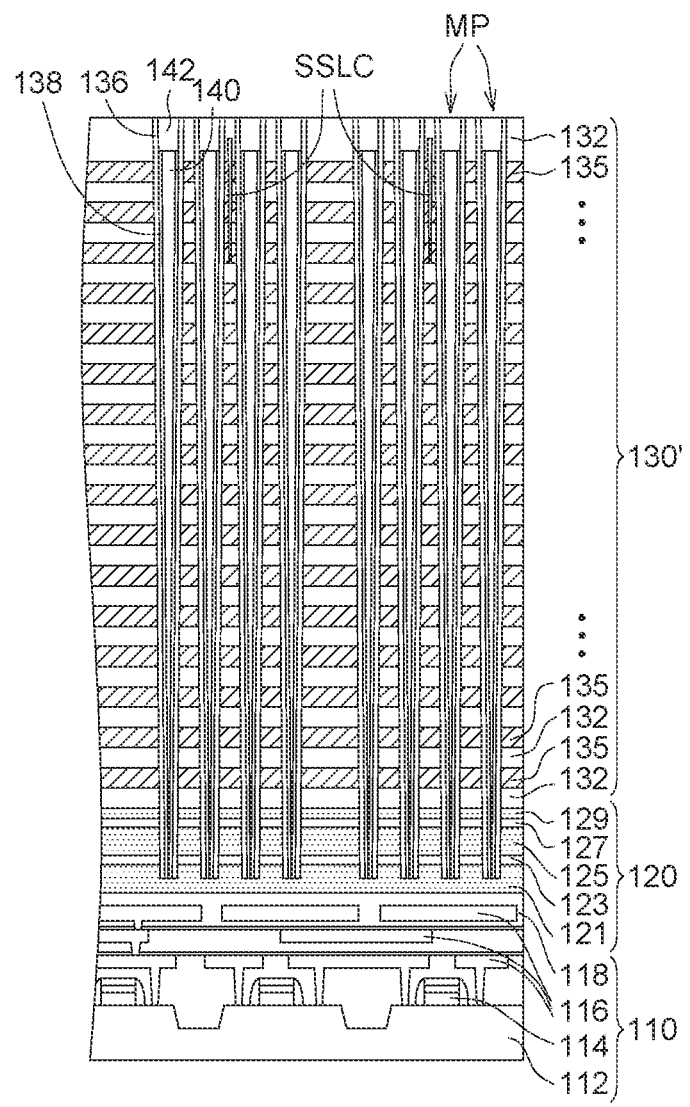

Referring to FIGS. 8A and 8B at the same time, a plurality of first openings 150p and a plurality of second openings 160p passing through the stacked structure 130' along the first direction are formed in the staircase area SA and the peripheral area PA, respectively. In the staircase area SA, the first openings 150p expose the corresponding landing pads 124, which are embedded in at least at the top portion of the third conductive layer 129 of the bottom plate 120. In the peripheral area PA, the second openings 160*p* expose the corresponding wires 116 of the circuit board 110. The first openings 150*p* and the second openings 160*p* are formed by, for example, an etching process (e.g., dry etching).

Figure 9A:
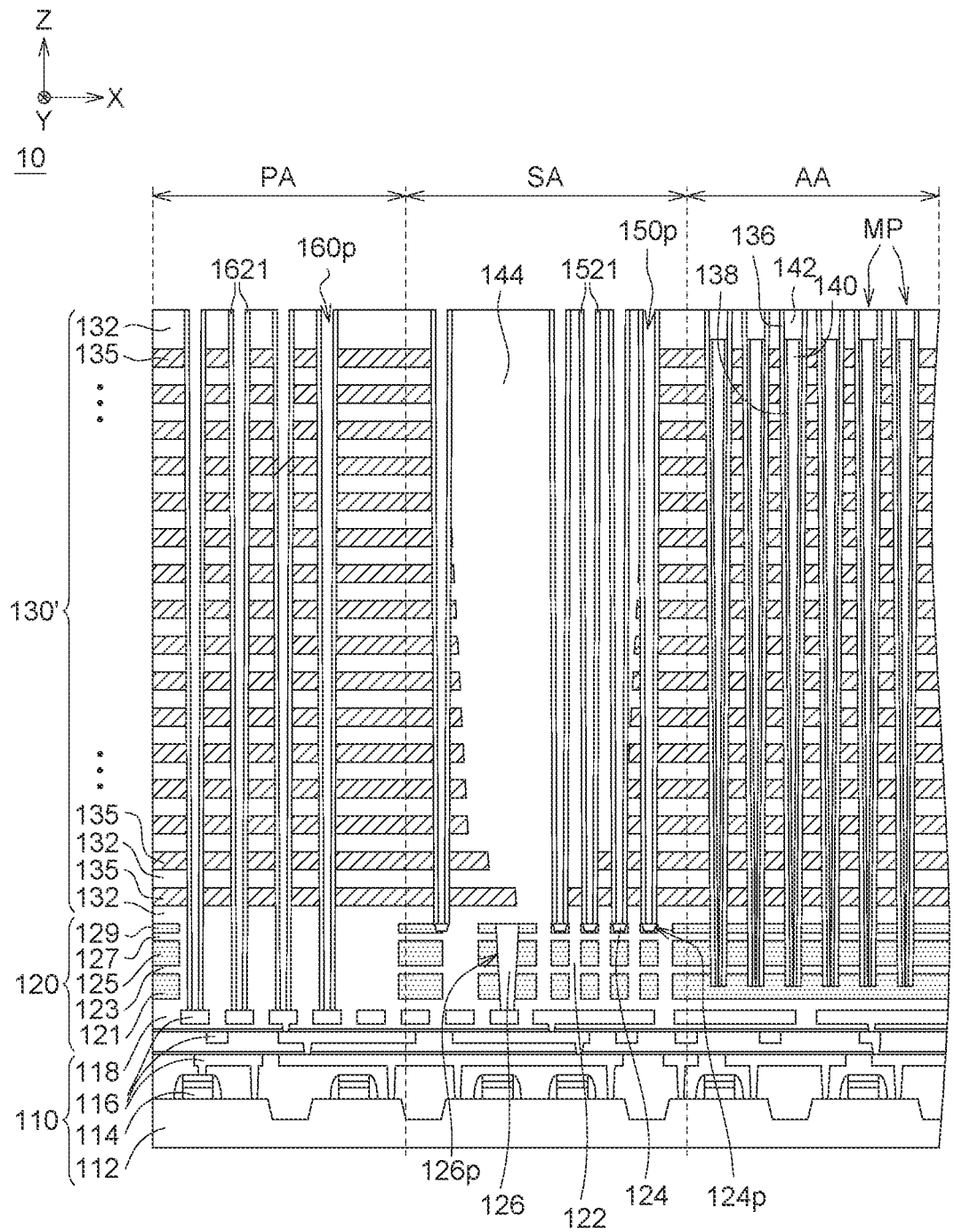
Figure 9B:
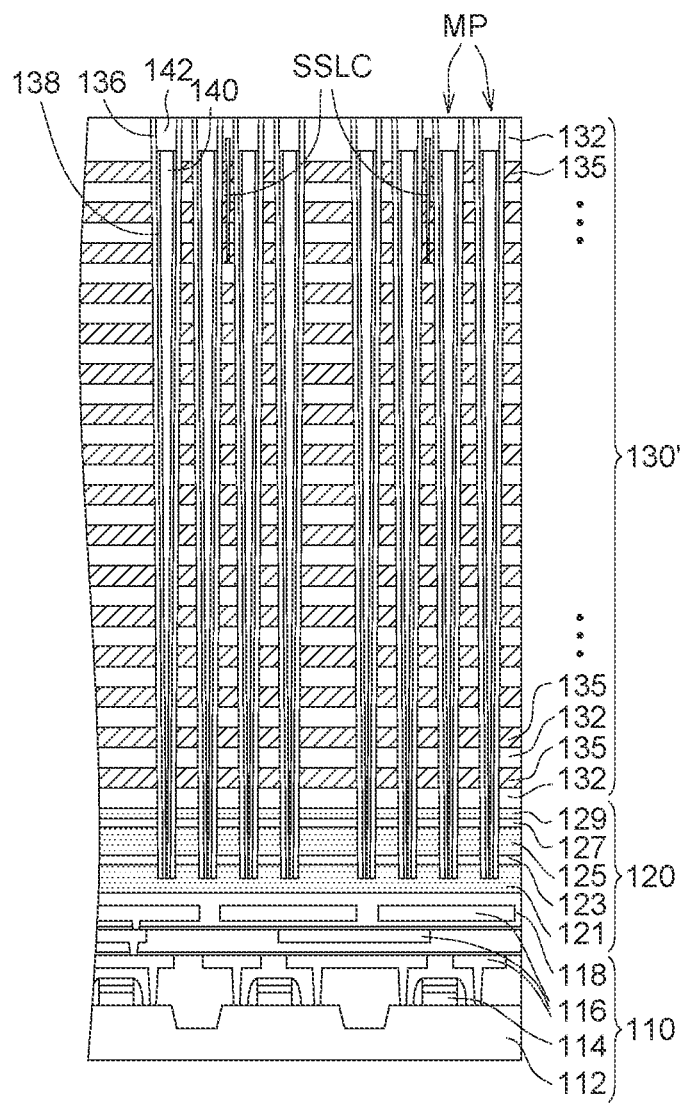

Referring to FIGS. 9A and 9B at the same time, first liners 1521 and second liners 1621 are formed in the first openings 150*p* and the second openings 160*p*, respectively. For example, the first liners 1521 and the second liners 1621 disposed on the sidewalls of the first openings 150*p* and the second openings 160*p* can be formed by a deposition process, respectively. Materials of the first liners 1521 and the second liners 1621 may include an oxide. In one embodiment, the oxide can be deposited in the first openings 150*p* and the second openings 160*p* first, and then the unnecessary oxide is removed by an etching process, and only the oxide on sidewalls of the first openings 150*p* and the second openings 160*p* remain, to form the first liners 1521 and the second liners 1621. The corresponding landing pads 124 for the first openings 150*p* and the corresponding wires 116 of the circuit board 110 for the second openings 160*p* are exposed.

Figure 10A:
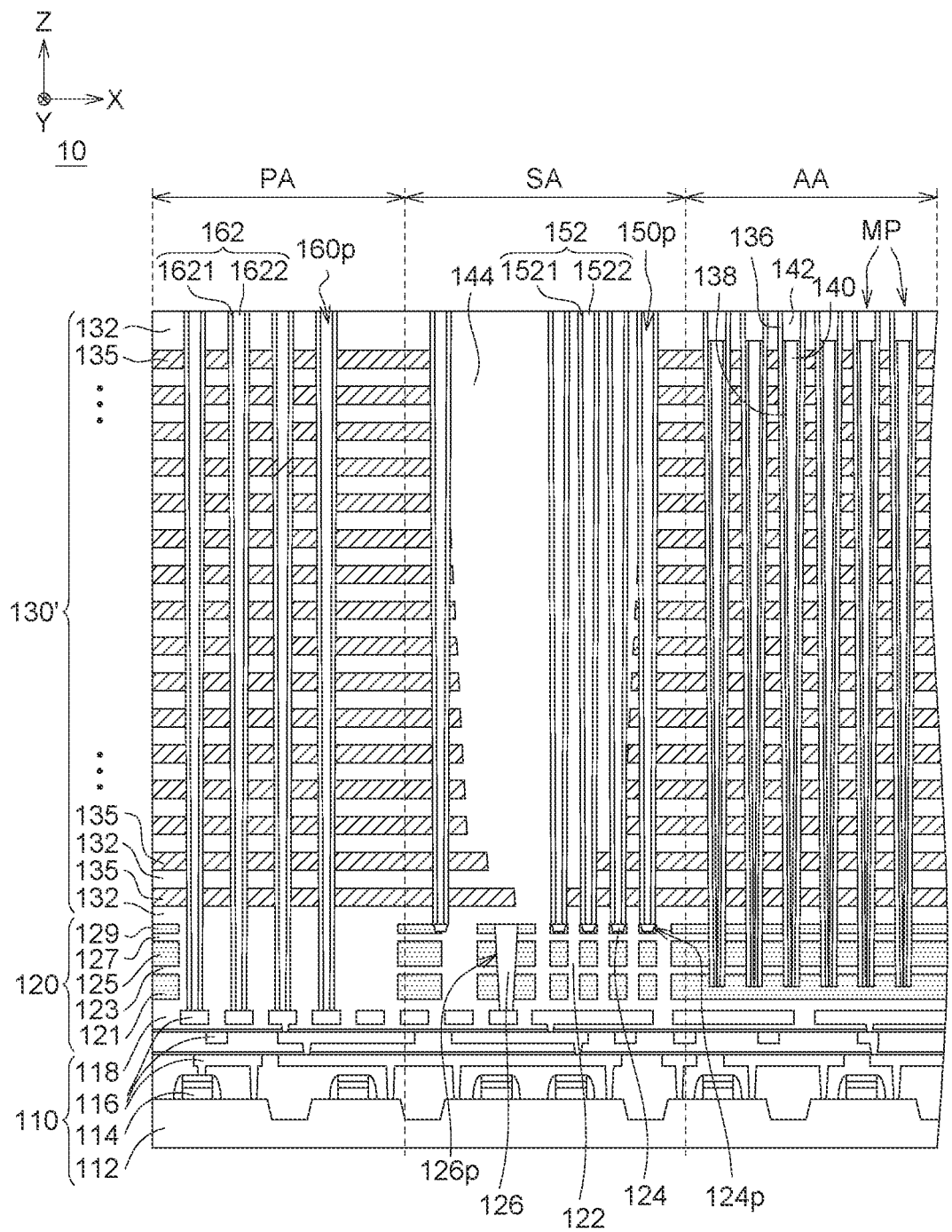
Figure 10B:
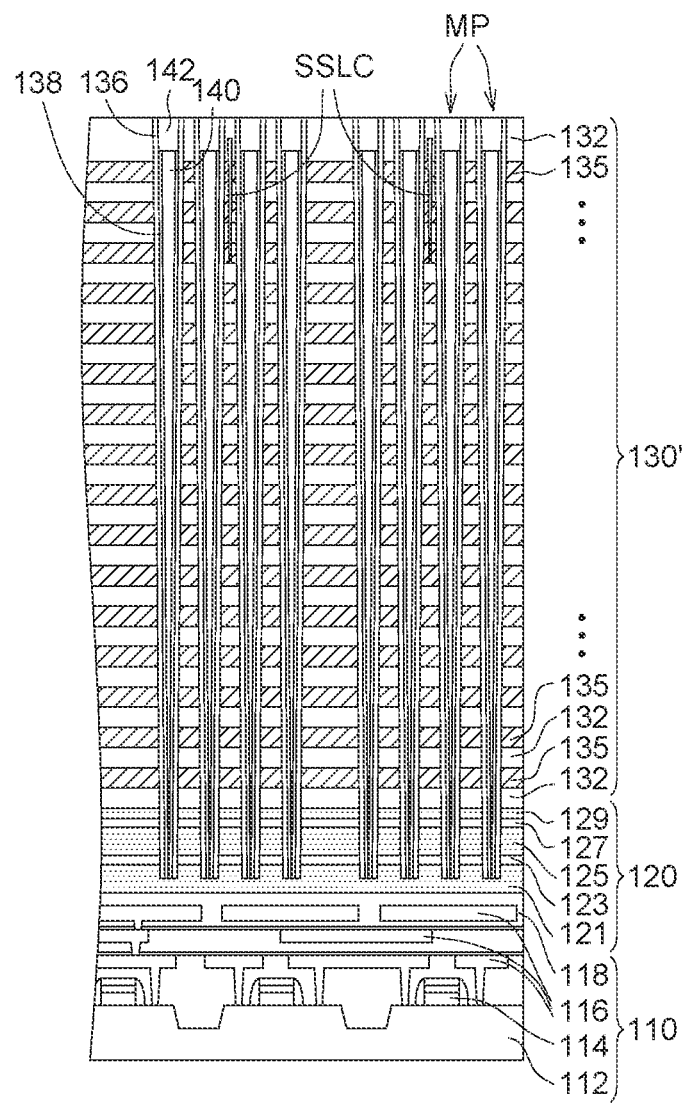

Referring to FIGS. 10A and 10B at the same time, in one example, the conductive material is filled in the first openings 150*p* and the second openings 160*p* (i.e., the space surrounded by the first liners 1521 and the second liners 1621), respectively. Hence, first conductive pillars 1522 and second conductive pillars 1622 are formed, respectively. In this way, support pillars 152 can be formed in the staircase area SA, and vertical contacts 162 can be formed in the peripheral area PA by the same process (e.g., the same etching process and deposition process). The support pillars 152 include first conductive pillars 1522 and first liners 1521 surrounding the first conductive pillars 1522, The first conductive pillars 1522 of the support pillars 152 are in contact with the corresponding landing pads 124 embedded in the third conductive layer 129 of the bottom plate 120. The vertical contacts 162 include second conductive pillars 1622 and second liners 1621 surrounding the second conductive pillars 1622. The vertical contacts 162 are in electrical contact with the corresponding wires 116 of the circuit board 110.

In another example, the materials filled in the first openings 150*p* and the second openings 160*p* (i.e., the space surrounded by the first liners 1521 and the second liners 1621) may be different in separated processes, respectively. The material filled in the first openings 150*p* may include a dielectric material, for example, oxide or nitride. The support pillar 152 is a dielectric pillar. The material filled in the second openings 160*p* may include a conductive material, for example, tungsten or polysilicon. The vertical contacts 162 include second conductive pillars 1622 and second liners 1621 surrounding the second conductive pillars 1622. The vertical contacts 162 are in electrical contact with the corresponding wires 116 of the circuit board 110.

Figure 11A:
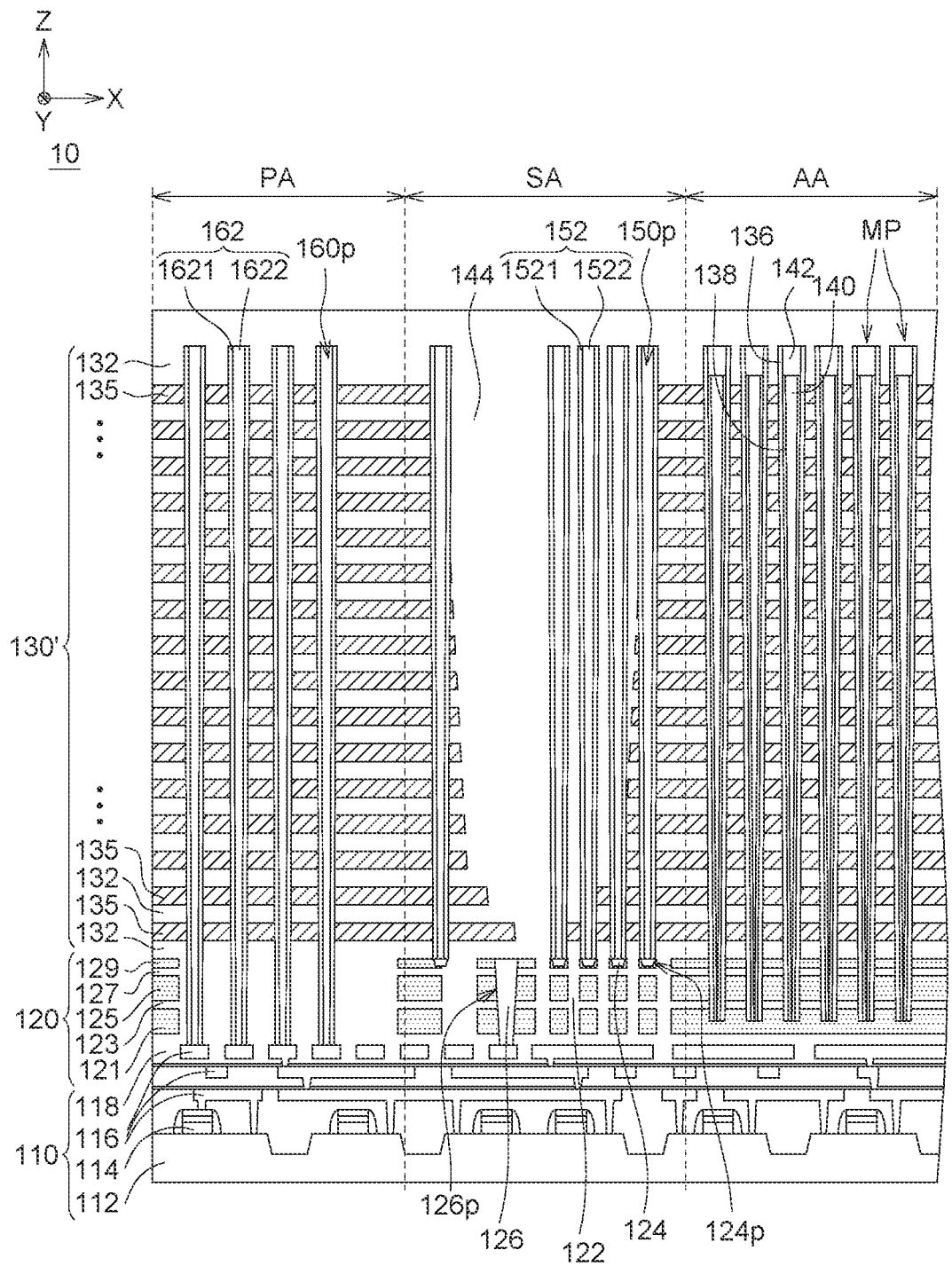
Figure 11B:
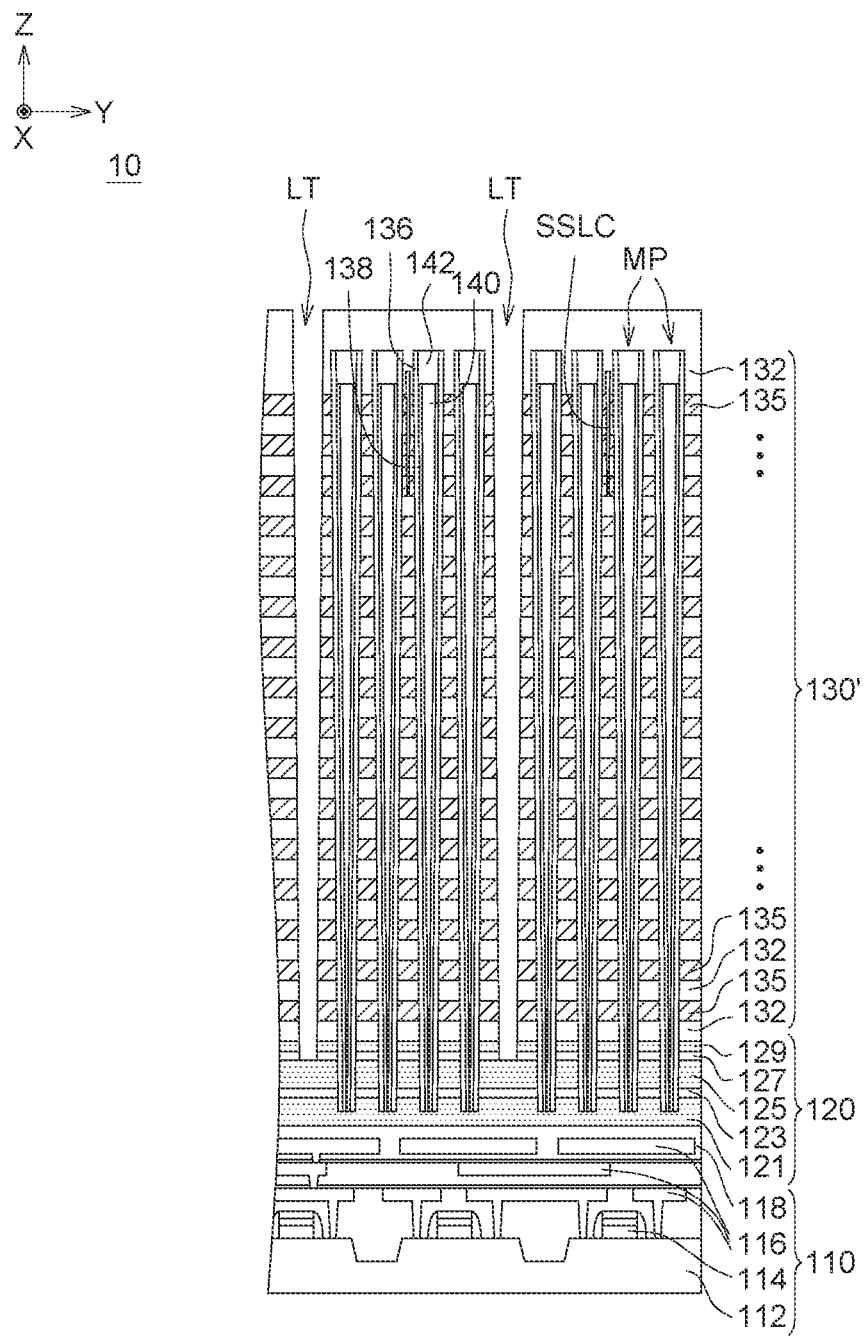

Referring to FIGS. 11A and 11B at the same time, a plurality of trenches LT passing through the stacked structure 130' along the first direction (e.g., Z direction) and extending along the second direction (e.g., X direction) are formed. The plurality of trenches LT stop on the second conductive layer 125 of the bottom plate 120, For example, the trenches LT may be formed by an etching process, such as dry etching.

Figure 12A:
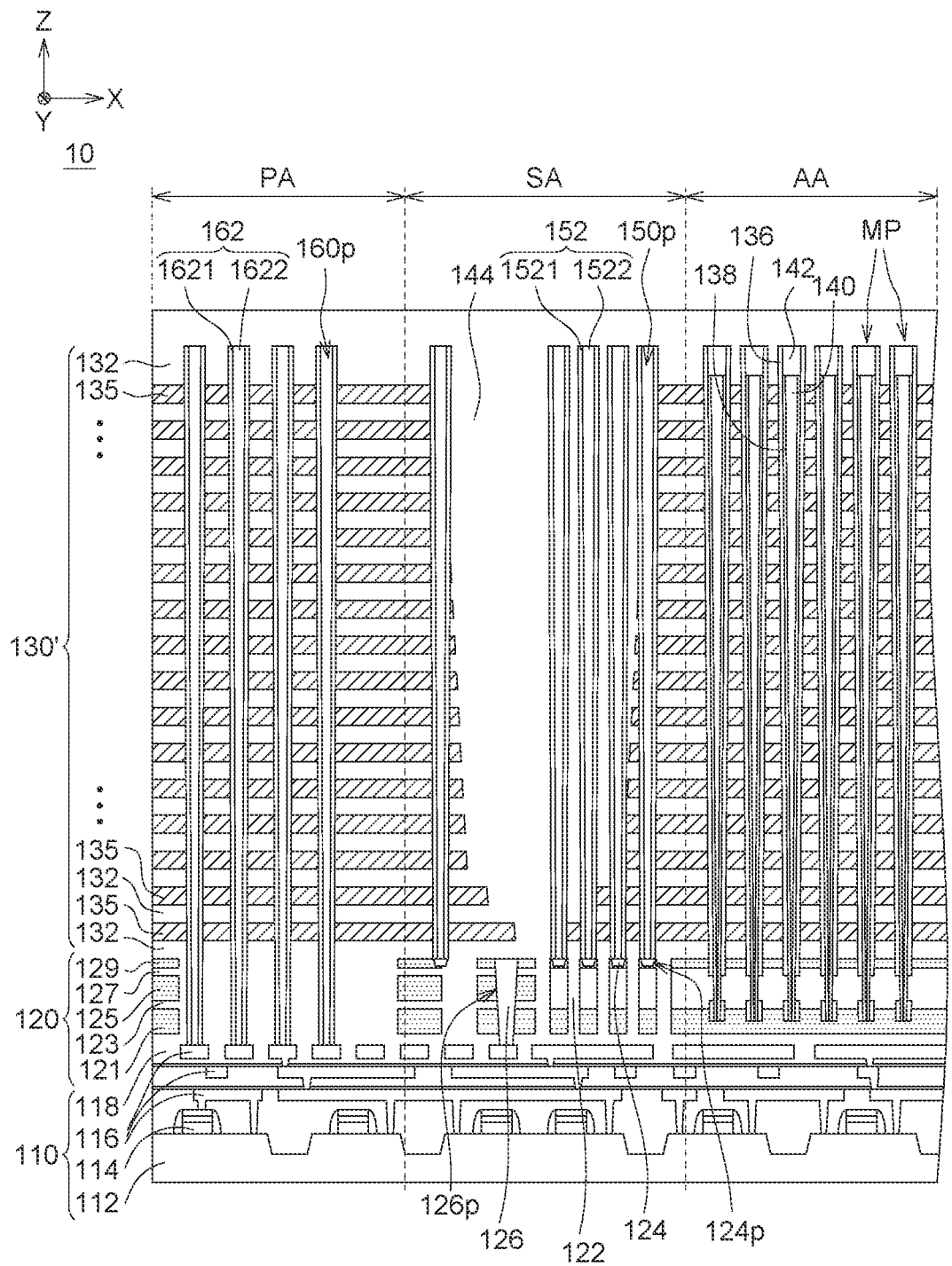
Figure 12B:
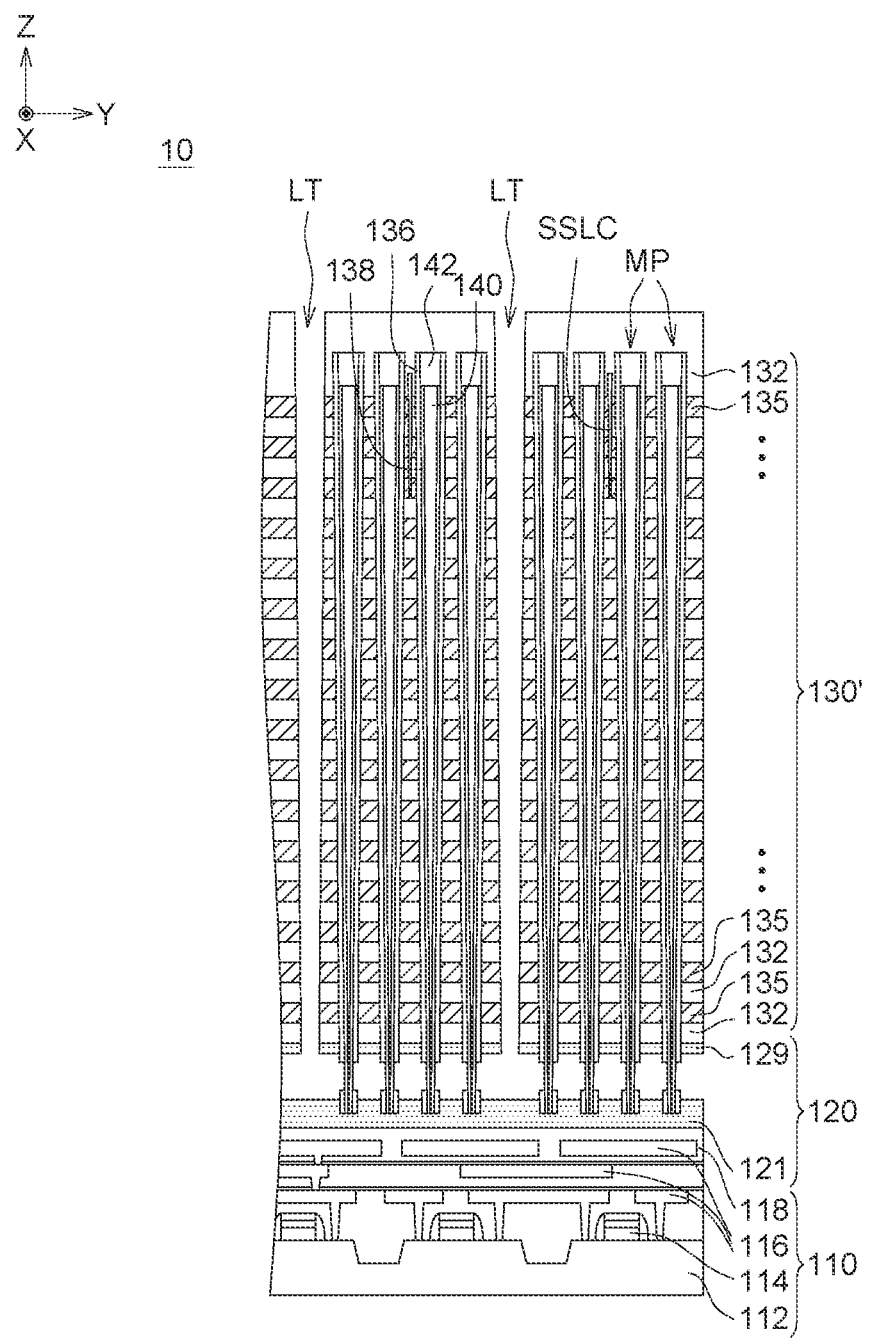

Referring to FIGS. 12A and 12B at the same time, the second conductive layer 125 in the bottom plate 120 is removed through the trenches LT by an etching process. Also, the first insulating layer 123 and the second insulating layer 127 are removed. In this step, a portion of the bottom plate 120 is removed to form an opening between the first conductive layer 121 and the third conductive layer 129, so the bottom support members 122 are required to maintain the stability of the structure. In some embodiments, a portion of the memory layers 136 of the corresponding memory pillars MP between the first conductive layer 121 and the third conductive layer 129 is removed. A portion of the channel layers 138 of the corresponding memory pillars MP is exposed to the opening.

Figure 13A:
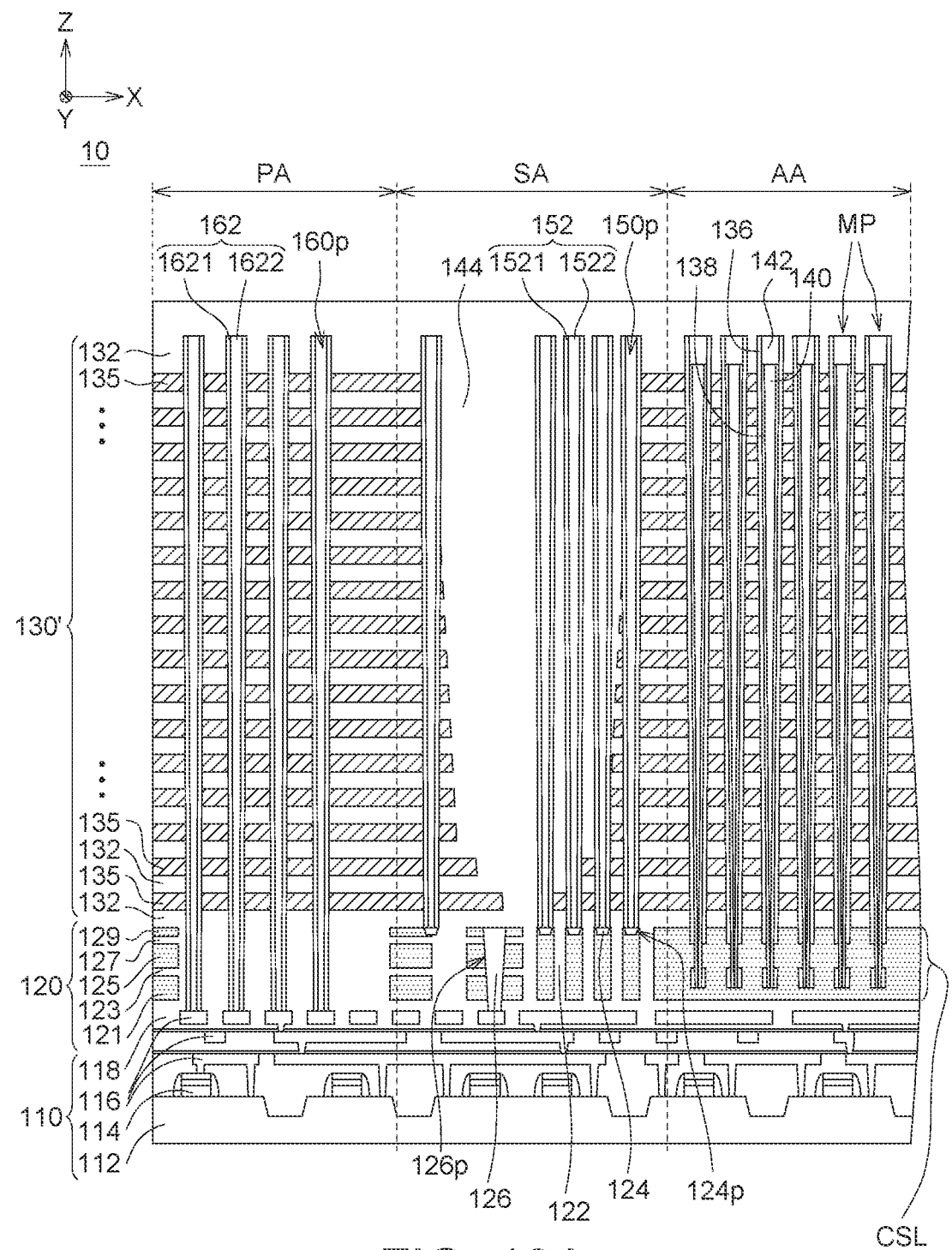
Figure 13B:
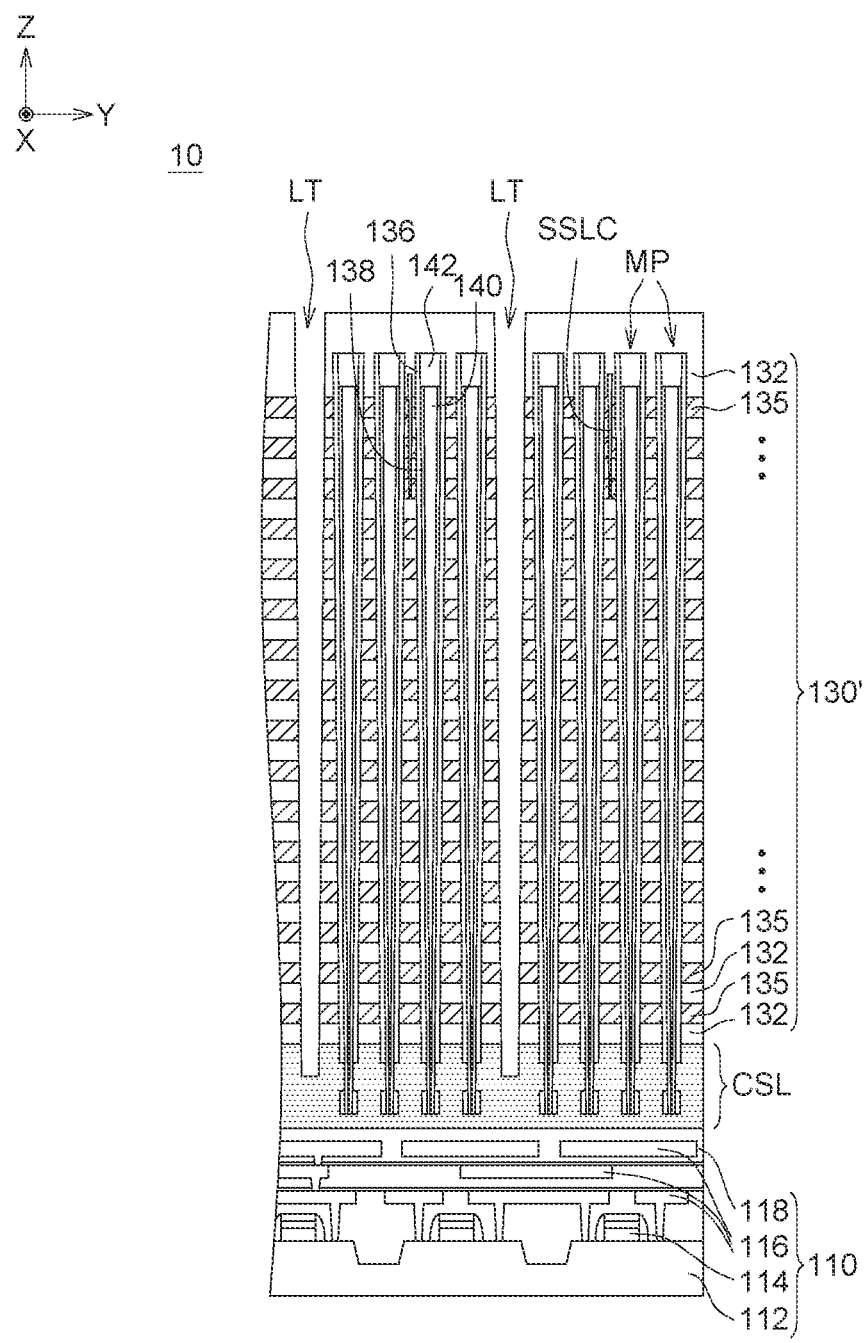

Referring to FIGS. 13A and 13B at the same time, by a deposition process, a conductive material is filled in the positions where the second conductive layer 125, the first insulating layer 123 and the second insulating layer 127 have been removed, and the conductive material is polysilicon, for example. In this way, the conductive material connects the first conductive layer 121 and the third conductive layer 129 to each other. The conductive material, the first conductive layer 121 and the third conductive layer 129 together form a bottom conductive layer, which may act as a common source line (CSL). There may be an interface between the first conductive layer 121 and the conductive material. Likewise, there may be an interface between the third conductive layer 129 and the conductive material. The portion of the channel layers 138 of the corresponding memory pillars MP contacts the bottom conductive layer. The channel layer 138 covering the bottom surface of the insulating pillar 140 of memory pillars MP is embedded in the bottom conductive layer. The memory layer 136 covering the bottom surface of the channel layer 138 of memory pillars MP is embedded in the bottom conductive layer. The discharge pillars 126 pass through the first conductive layer 121, the first insulating layer 123, the second conductive layer 125, the second insulating layer 127 and the third conductive layer 129 and are electrically connected to the corresponding wires 116. The processes of FIGS. 13A and 13B, firstly, the conductive material may be filled in the positions where the second conductive layer 125, the first insulating layer 123 and the second insulating layer 127 are removed, and filled in the trenches LT, and then the conductive material filled in the trenches LT is removed by an etch-back process, and the trenches LT are exposed again.

Figure 14A:
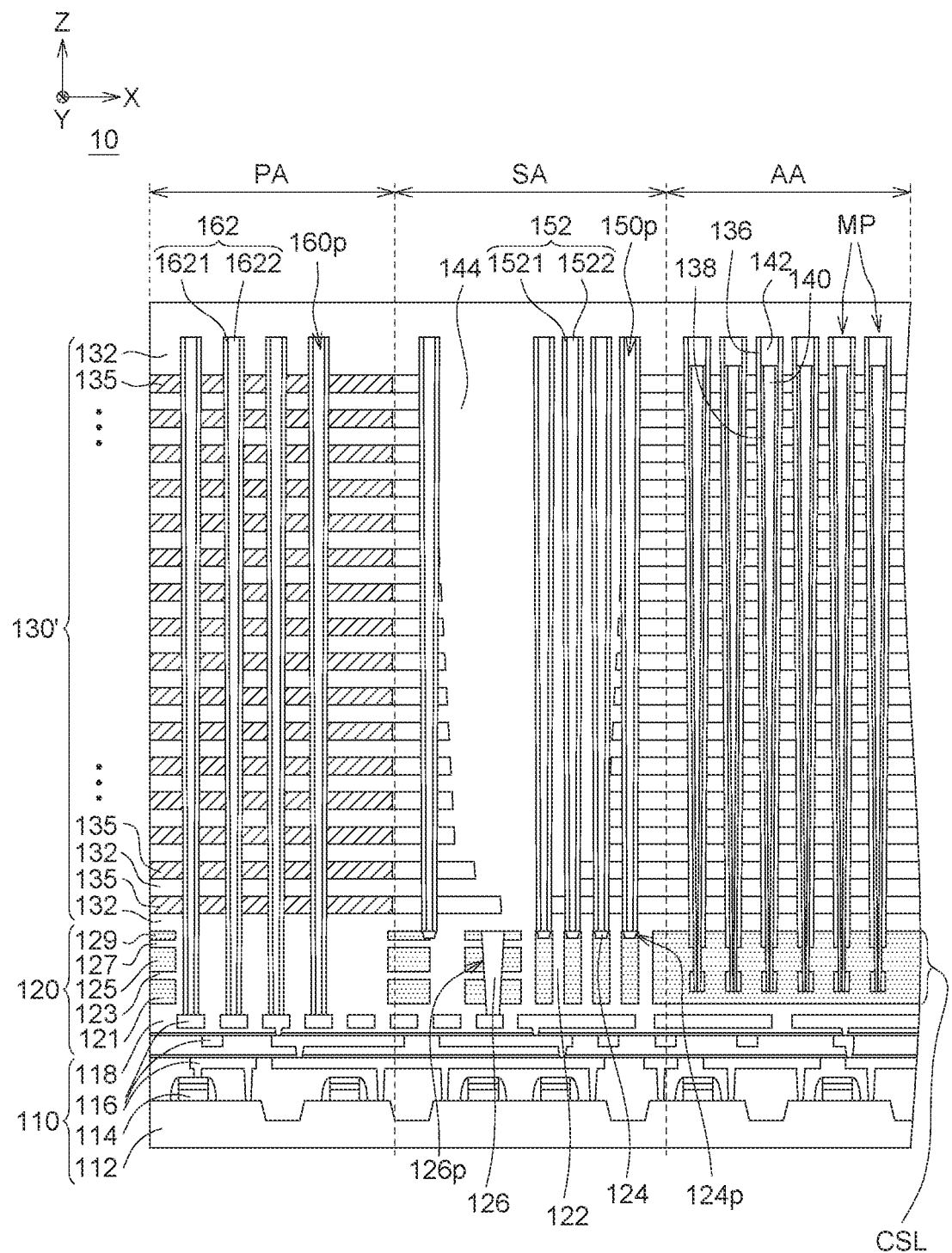
Figure 14B:
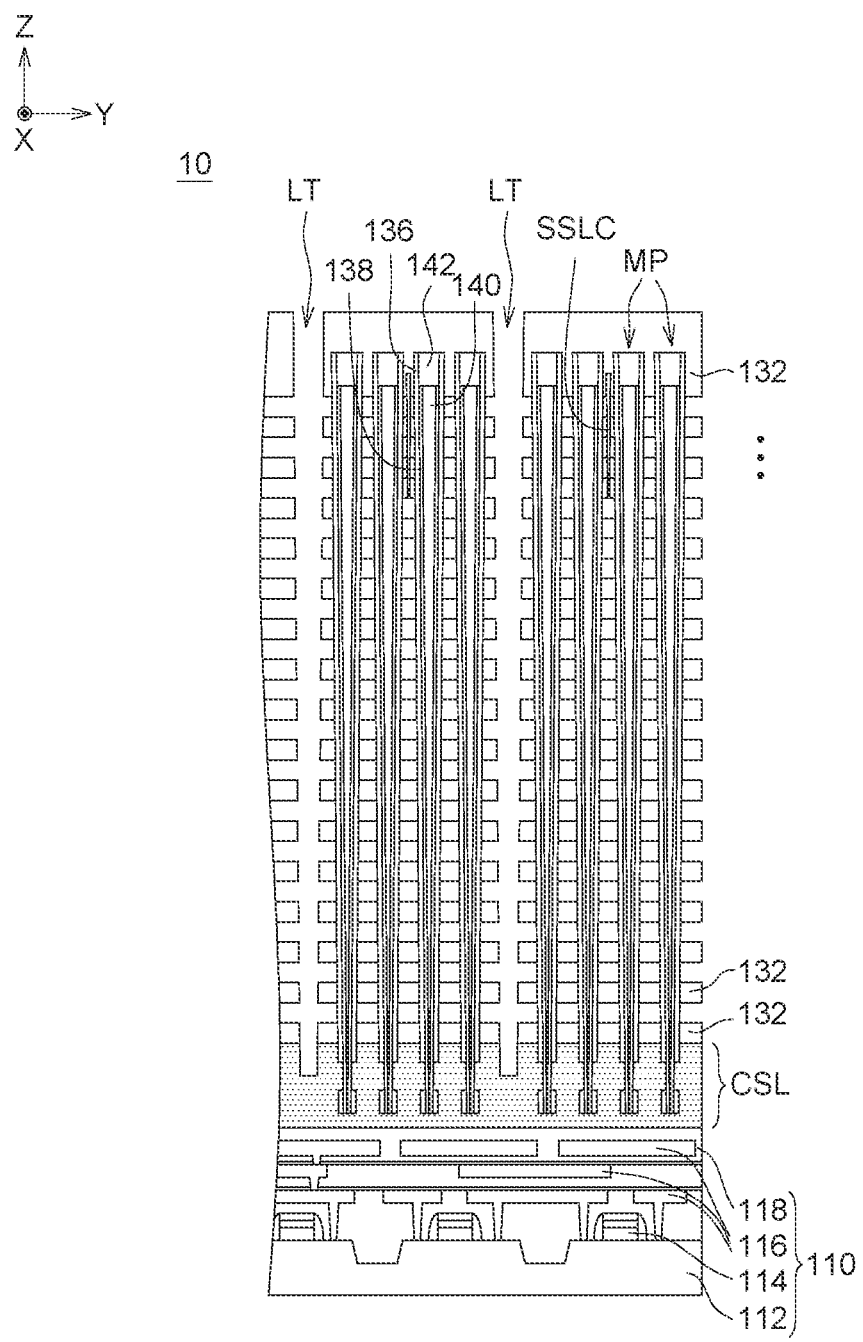

Referring to FIGS. 14A and 14B simultaneously, the sacrificial layers 135 in the array area AA and the staircase area SA are removed through the trenches LT by an etching process. In this step, since the present application has the support pillars 152, the support pillars 152 can provide sufficient supporting force, even if the sacrificial layers 135 are removed, the support pillars 152 can still maintain the stability of the entire structure and the entire structure is not easy to collapse.

Figure 15A:
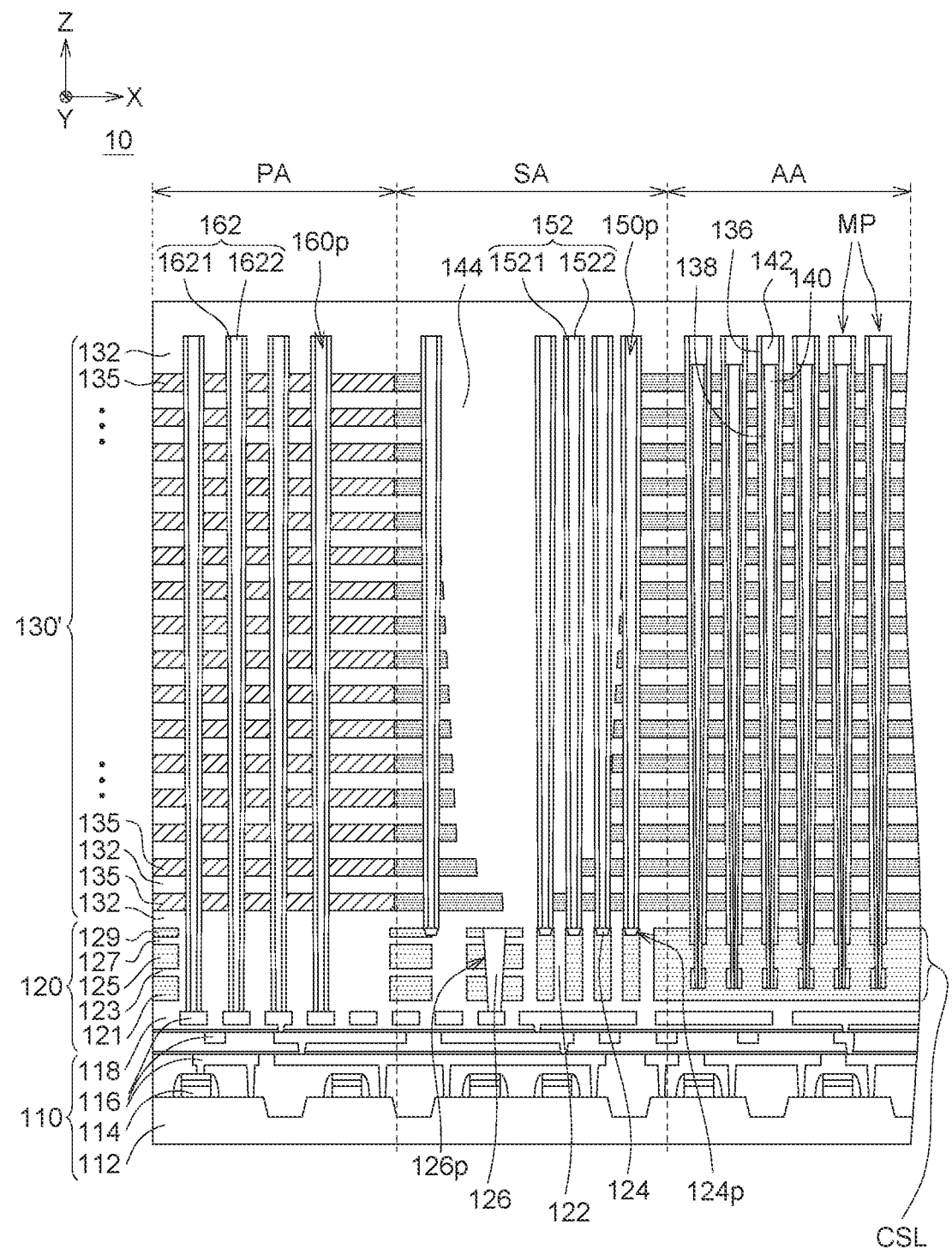
Figure 15B:
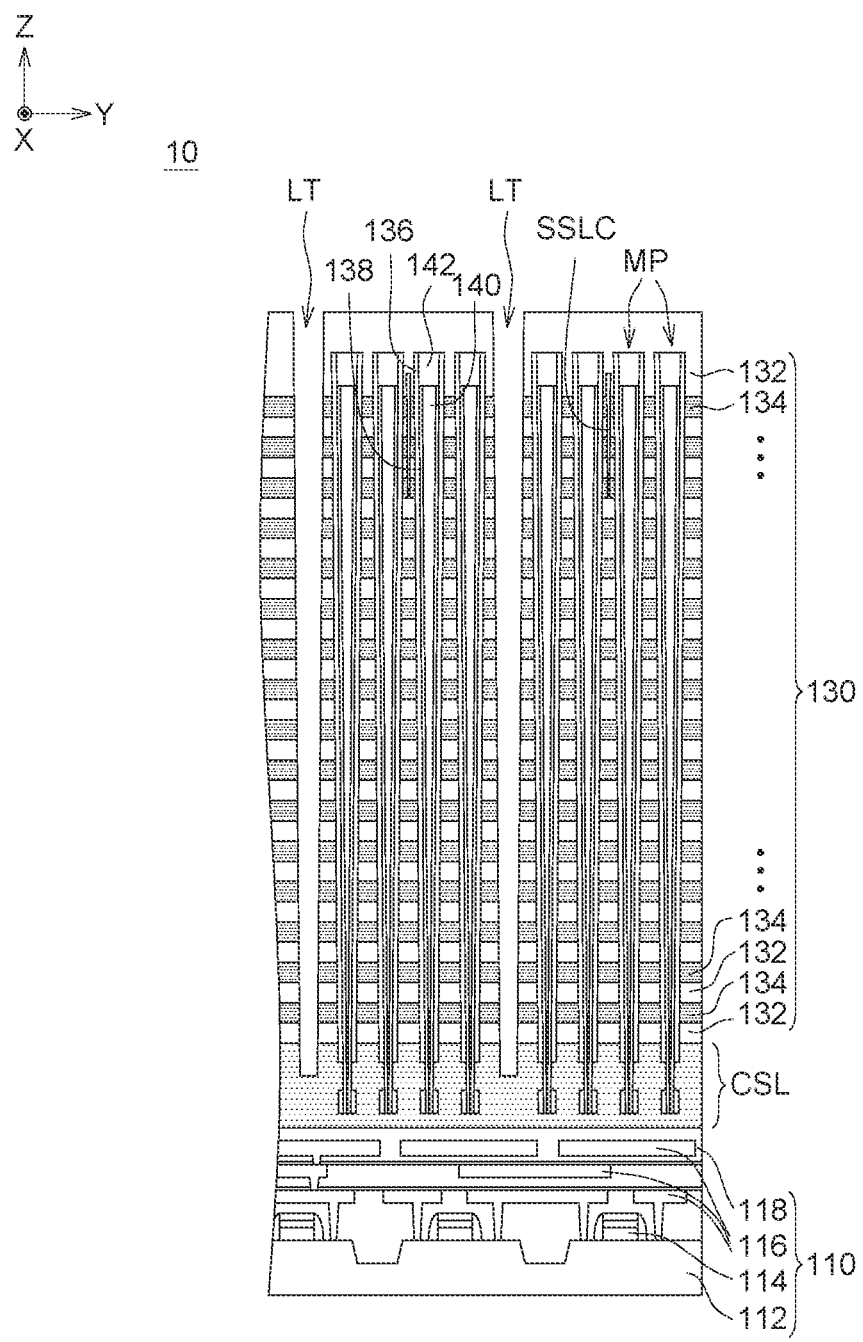

Referring to FIGS. 15A and 15B at the same time, a conductive material is filled in the positions where the sacrificial layers 135 are removed. Therefore, in the array area AA and the staircase area SA, a stack 130 in which conductive layers 134 and the insulating layers 132 are alternately stacked is formed. In one example, the conductive material of the conductive layer 134 may include tungsten. In the peripheral area PA, the sacrificial layers 135 and the insulating layers 132 remain alternately stacked in the stacked structure 130'. That is, the sacrificial layers 135 in the peripheral area PA are not removed. The steps shown in FIGS. 14A to 15B may also be referred to as a gate replacement process.

Figure 16A:
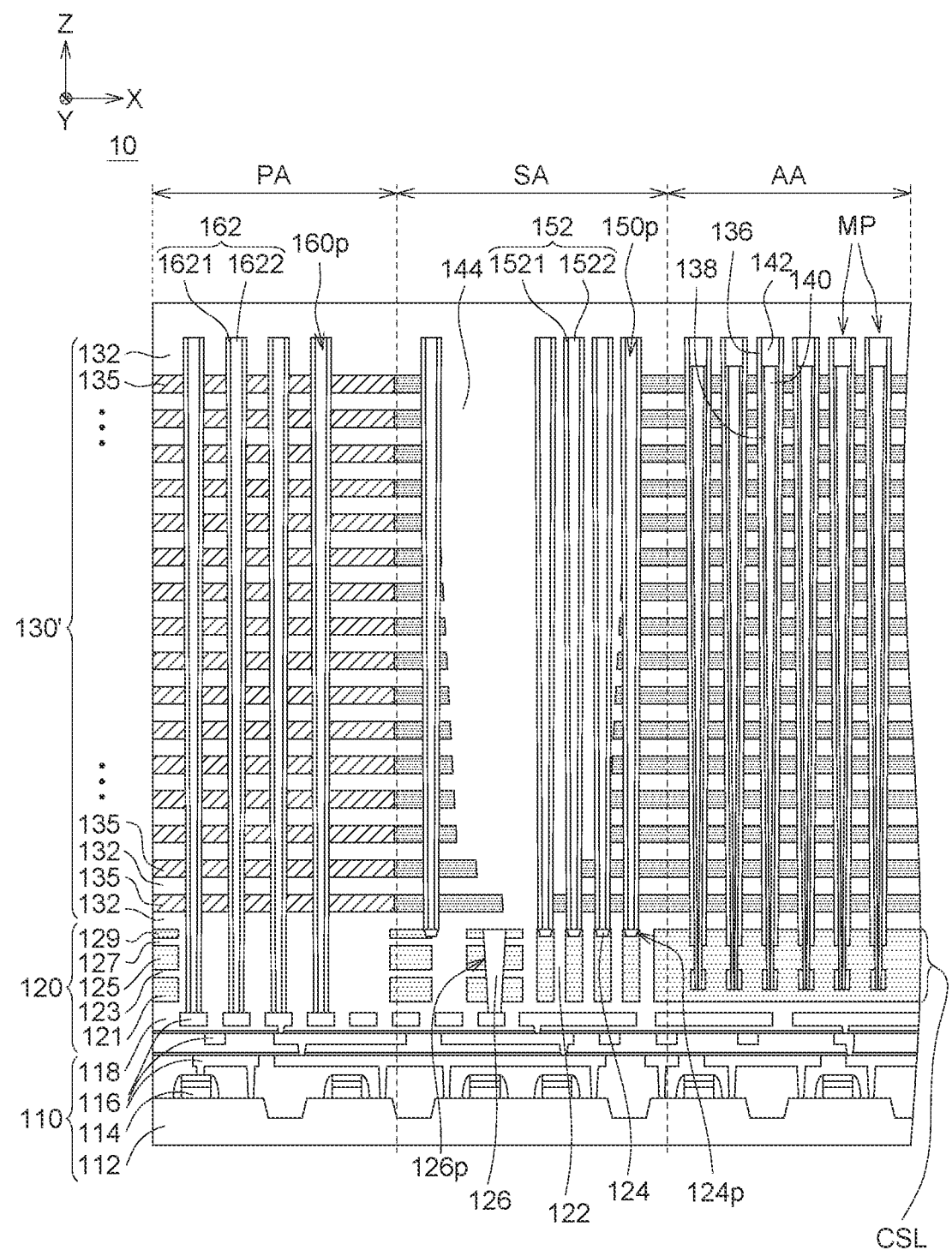
Figure 16B:
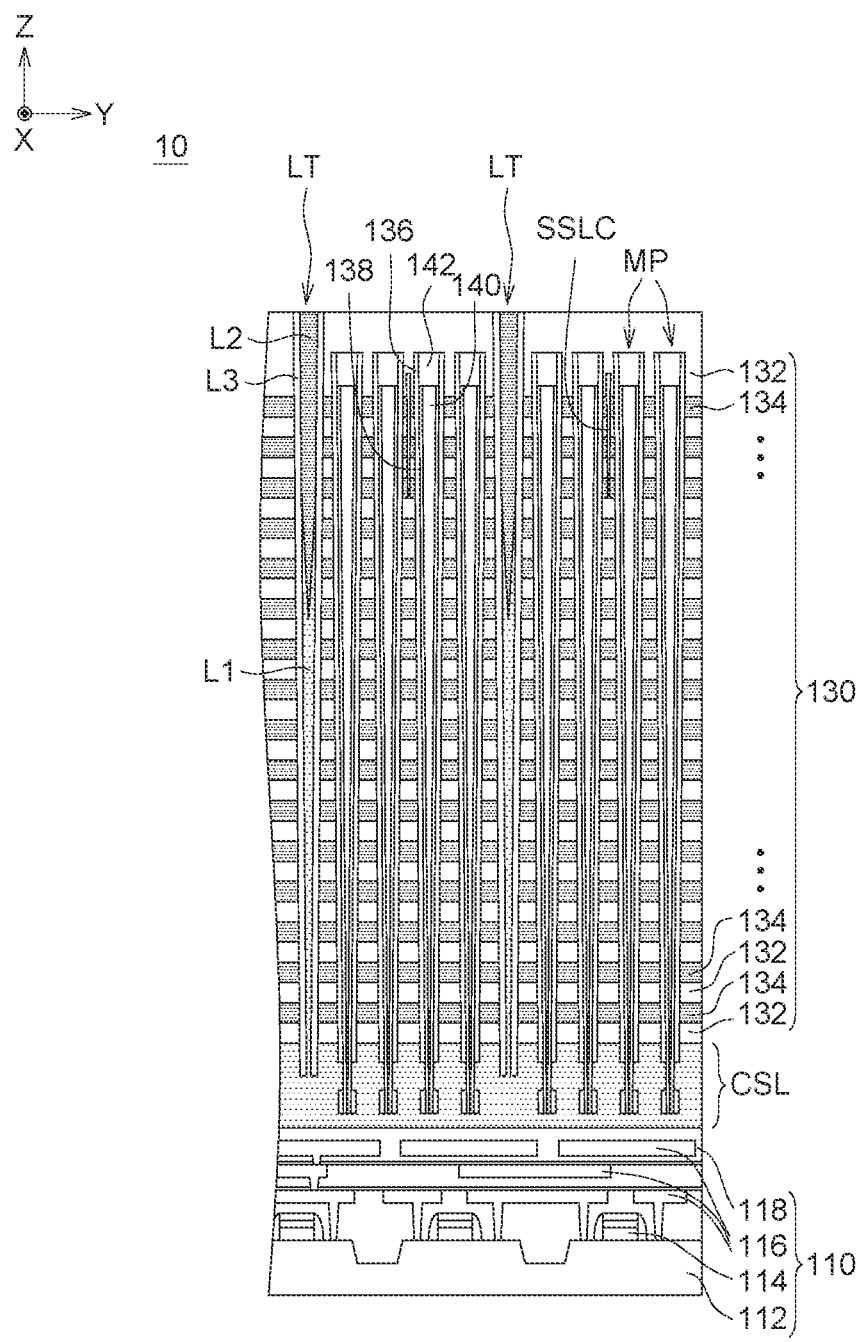

Referring to FIGS. 16A and 16B at the same time, the trenches LT are slightly enlarged, and the insulating material and conductive material are filled in the trenches LT in sequence. The filled trenches LT including insulating sidewalls L3 on sidewalls of trenches LT. The filled trenches LT includes first conductive layers L1 and second conductive layers L2 surrounded by the insulating sidewalls L3. The first conductive layers L1 and the second conductive layers L2 in the filled trenches LT electrically contact the bottom conductive layer, which may act as a common source line (CSL). The materials of the first conductive layers L1 and the second conductive layers L2 may be different from each other, for example, the first conductive layers L1 may be polysilicon, and the material of the second conductive layers L2 may be metal, such as tungsten. The material of insulating sidewalls L3 may include oxide, but the invention is not limited thereto.

Figure 17A:
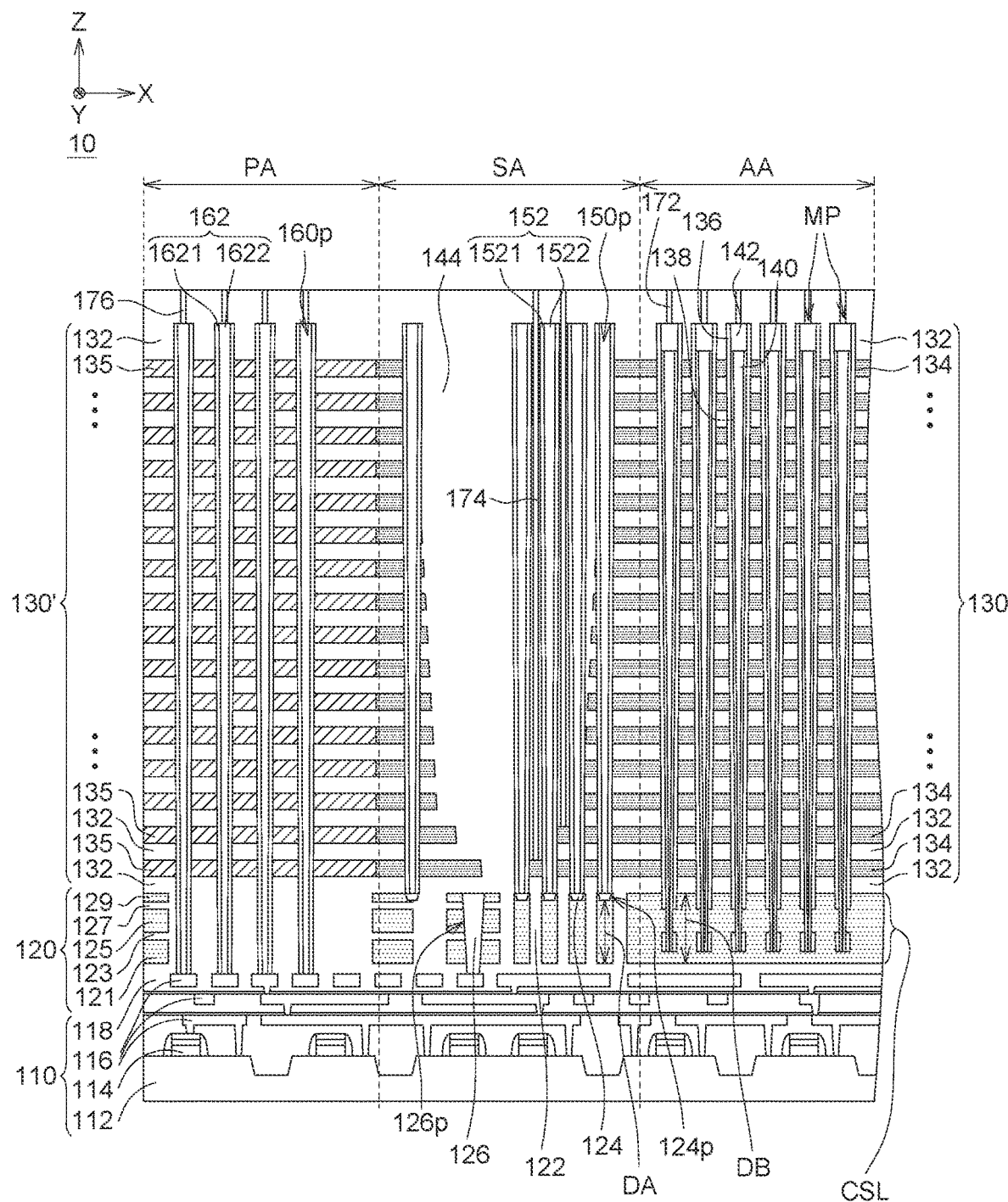
Figure 17B:
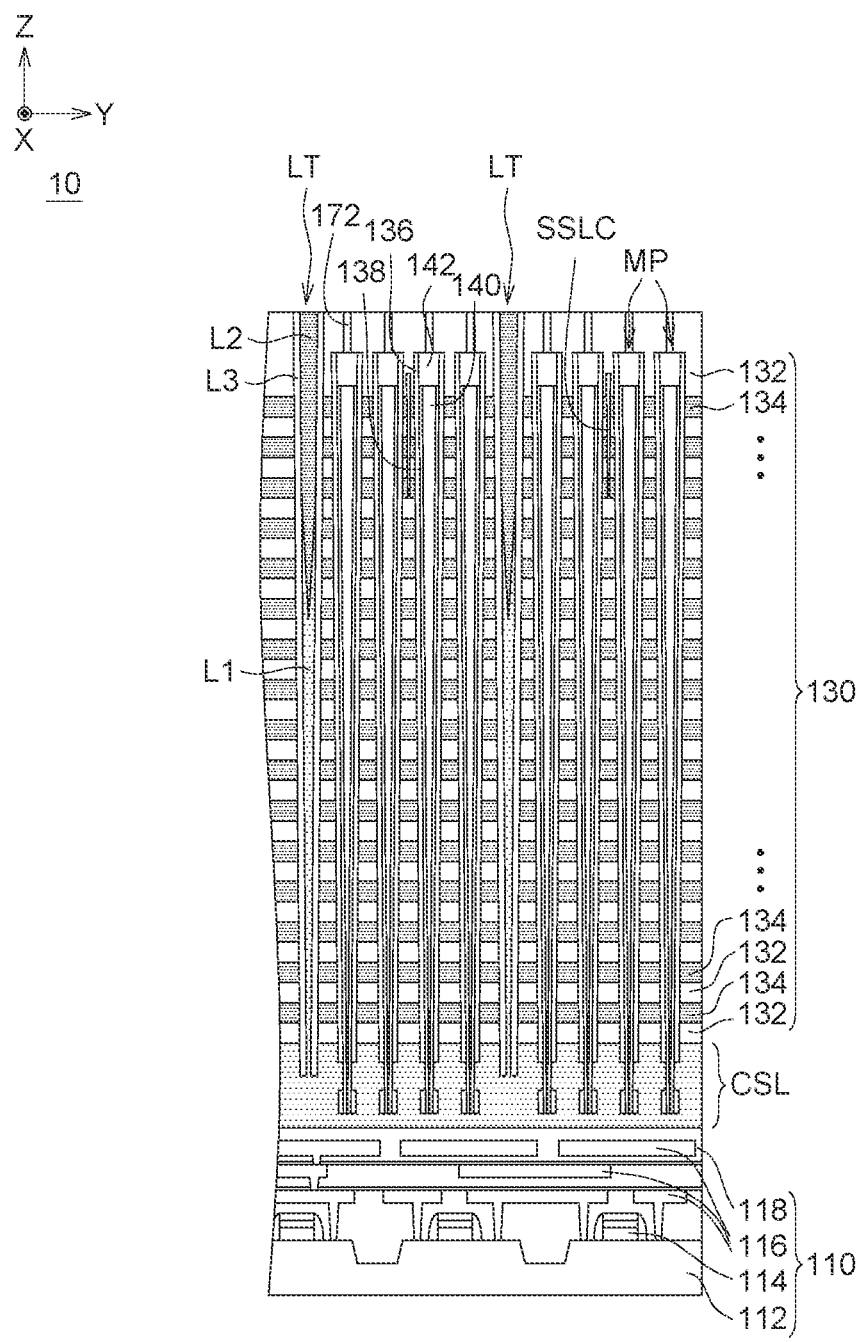

Referring to FIGS. 17A and 17B at the same time, a plurality of extending contacts 174 are formed and disposed on the landing regions of the staircase area SA. The plurality of extending contacts 174 are in contact with the corresponding conductive layers 134. A back end of line (BEOL) process is performed to form interconnects 172 contacting the bond pads 142 and the extending contacts 174. A plurality of connecting members 176 are formed to connect the corresponding vertical contacts 162 in the peripheral area PA. The support pillars 152 do not connect to any interconnect 172 in the back end of line (BEOL) process. It should be understood that the back end of line process also includes more steps of forming wires/conductive layers/plugs (not shown), and the interconnects 172, the extending contacts 174 and the connecting members 176 can be electrically connected to other circuits (not shown) by more wires/conductive layers/plugs (not shown), One of ordinary skilled in the art can manufacture the device in a conventional manner, which will not be repeated here.

A semiconductor device 10 according to an embodiment of the present invention is formed by the above steps, as shown in FIGS. 17A to 17B. The semiconductor device 10 includes a circuit board 110, a bottom plate 120, a stacked structure 130', a stack 130, memory pillars MP, support pillars 152 and vertical contacts 162. The bottom plate 120 is disposed over the circuit board 110. The stacked structure 130' and the stack 130 are disposed side by side on the bottom plate 120, and the stacked structure 130' and the stack 130 are adjacent to each other. The support pillars 152 and the vertical contacts 162 pass through the stack 130 and the stacked structure 130' along the first direction (e.g., Z direction), respectively. The memory pillars MP pass through the stack 130 along the first direction (e.g., Z direction).

Referring to FIGS. 17A-17B again, the circuit board 110 includes a substrate 112, a plurality of circuit structures 114, a plurality of wires 116 and an insulating material 118. The circuit structures 114 are disposed on the substrate 112, and the wires 116 are respectively electrically connected to the corresponding circuit structures 114. The insulating material 118 covers the substrate 112, the circuit structures 114 and the wires 116. The circuit board 110 corresponds to a peripheral area PA, a staircase area SA, and an array area AA. The staircase area SA is disposed between the peripheral area PA and the array area AA, The plurality of memory pillars MP pass through the stack 130 along the first direction in the array area AA.

The bottom plate 120 may include a bottom conductive layer CSL (e.g., in the staircase area SA and the array area AA). The bottom conductive layer CSL may serve as a common source line in the semiconductor device 10. The semiconductor device 10 further includes a plurality of landing pads 124, a plurality of discharge pillars 126 and a plurality of bottom support members 122. The landing pads 124 are embedded in at least a top portion of the bottom conductive layer CSL in the staircase area SA and directly contact (physically and electrically contact) the bottom conductive layer CSL. The discharge pillars 126 pass through the bottom conductive layer CSL along the first direction (e.g., Z direction) and electrically contact the bottom conductive layer CSL and the corresponding wires 116. During manufacturing the semiconductor device 10, many charges may be accumulated, and the discharge pillars 126 can discharge these accumulated charges downward, avoiding excessive voltage differences between the conductors above and below. The bottom support members 122 are disposed in the staircase area SA and pass through the bottom conductive layer CSL along the first direction (e.g., Z direction). The bottom support members 122 are separated from each other, and can maintain the stability of the structure during the formation of the bottom conductive layer CSL, for example, providing a supporting force in the steps shown in FIGS. 12A and 12B, In the present embodiment, the discharge pillars 126 include a conductive material, and the landing pads 124 include a conductive material. The discharge pillars 126 and the landing pads 124 can be formed under the same process (e.g., the same etching process and deposition process, as shown in FIGS. 5-6), and the conductive material of the discharge pillars 126 may be the same as the conductive material of the landing pads 124, but the present invention is not limited thereto.

In the array area AA and the staircase area SA, the stack 130 includes a plurality of conductive layers 134 and a plurality of insulating layers 132 alternately stacked along the first direction. The stacked structure 130' includes a plurality of sacrificial layers 135 and a plurality of insulating layers 132 alternately stacked along the first direction. The insulating layers 132 of the stack 130 and the insulating layers 132 of the stacked structure 130' are connected to each other. The conductive layers 134 of the stack 130 and the sacrificial layers 135 of the stacked structure 130 are connected to each other in the staircase area SA or the peripheral area PA. The conductive layers 134 may include one or more string select lines in a top portion of the stack 130, a plurality of word lines in a middle portion of the stack 130, and one or more ground select lines in a bottom portion of the stack 130.

The support pillars 152 and the vertical contacts 162 pass through the stack 130 and the stack structure 130' along the first direction (e.g., Z direction). In more detail, the support pillars 152 pass through the stack 130 and pass through the bottommost conductive layer 134 in the stack 130 (i.e., the bottommost ground select line) and extend to the landing pads 124 on the bottom conductive layer CSL. The support pillars 152 may directly contact (physically and electrically contact) the landing pads 124. In other words, the landing pads 124 are disposed between the bottom conductive layer CSL and the support pillars 152. A bottom surface of the landing pads 124 in the staircase area SA is lower than a top surface of the bottom conductive layer CSL in the array area AA, That is, a distance DA between the bottom surface of the landing pad 124 and a bottom surface of the bottom conductive layer CSL in the staircase area SA in the first direction is smaller than a distance DB between the top surface of the bottom conductive layer CSL and the bottom surface of the bottom conductive layer CSL in the array area AA in the first direction. The support pillars 152 and the landing pads 124 in the staircase area SA overlap each other in the first direction (e.g., Z direction). In one embodiment, the support pillars 152 may include conductive materials.

Further, the support pillars 152 include first conductive pillars 1522 and first liners 1521 surrounding the first conductive pillars 1522. In the present embodiment, the first conductive pillars 1522 directly contact the landing pads 124, and the material of the first conductive pillars 1522 can be the same as the material of the landing pads 124 (e.g., tungsten). However, the present invention is not limited thereto, and in other embodiments, the material of the first conductive pillars 1522 may be different from the material of the landing pads 124. In another embodiment, the support pillar 152 is a dielectric pillar. Since there are landing pads 124 disposed under the support pillars 152, during the formation of the support pillars 152, the landing pads 124 can provide good etching selectivity when forming openings (e.g., the first openings 150 shown in FIG. 8A) during the etching process. Compared with the comparative example without the landing pads, the etching depth of the present invention can be better controlled, and the formation of the etching openings can be properly stopped on the landing pads 124.

The vertical contacts 162 pass through the stacked structure 130' and the bottom plate 120 (i.e., passing through the bottom conductive layer CSL) along the first direction (e.g., Z direction) and extend to the corresponding wires 116. The vertical contacts 162 include second conductive pillars 1622 and second liners 1621 surrounding the second conductive pillars 1622. In the present embodiment, the material of the second conductive pillars 1622 may be the same as the material of the first conductive pillars 1522 (e.g., tungsten), and the material of the second liners 1621 may be the same as the material of the first liners 1521 (e.g., oxide), but the present invention is not limited thereto. The support pillars 152 and the vertical contacts 162 can be formed in the same process (as shown in FIGS. 8A-10A), that is, the formation of the support pillars 152 and the vertical contacts 162 can be integrated in the same deep etching process. There is no need to additionally fabricate the support pillars 152 through an additional process.

In the stack 130 corresponding to the array area AA, each of conductive layers 134 intersects the memory layer 136 and the channel layer 138 to form a string of memory cells extending in the first direction (e.g., Z direction). The channel layer 138 is in electrical contact with the bottom conductive layer CSL. Each of memory pillars MF includes memory cell strings connected in series in a NAND type, and the present invention is not limited thereto. Also, the trenches LT and the top isolating members SSLC extend along the first direction (e.g., Z direction) and the second direction (e.g., X direction), dividing the stack 130 into a predetermined number of blocks and sub-blocks (not shown). Each of trenches LT includes a first conductive level L1 (e.g., polysilicon), a second conductive level L2 (e.g., tungsten), and insulating sidewalls L3 (e.g., oxide). The insulating sidewalls L3 allow the first conductive level L1 and the second conductive level L2 to be isolated from adjacent layers (e.g., conductive layers 134). The first conductive layer L1 is in electrical contact with the underlying bottom conductive layer CSL. The top isolating members SSLC (e.g., oxide) pass through the conductive layers 134 corresponding to the top portion of the stack 130 in the first direction (e.g., Z direction) to define the string select lines.

In the staircase area SA of the stack 130, the conductive layers 134 have a stepped structure to provide landing regions connected with the extending contacts 174, so that the extending contacts 174 are in electrical contact with the corresponding conductive layers 134. The extending contacts 174 may include word line contacts, FIGS. 18A to 18F illustrate a manufacturing flow chart of the semiconductor device 20 according to another embodiment of the present invention. FIGS. 18A to 18F correspond to the plane formed by the second direction (e.g., X direction) and the third direction (e.g., Y direction).

The semiconductor device 20 has the same and similar processes and structures as the semiconductor device 10, and the difference is in that the semiconductor device 20 further includes vertical support members 180 in staircase area SA.

Figure 18A:
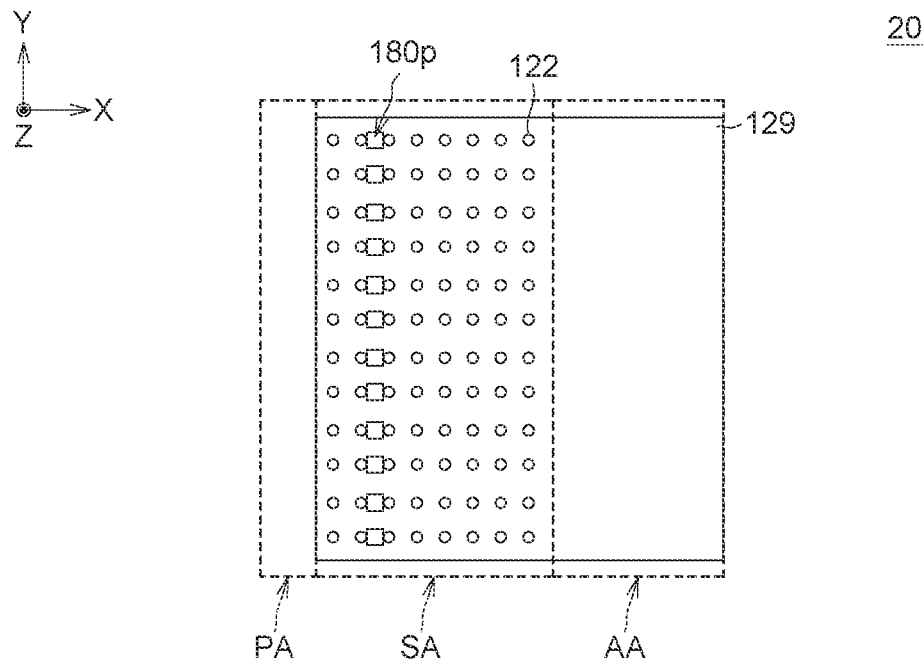
FIGS. 18A-18F illustrate a manufacturing flow chart of a semiconductor device according to another embodiment of the present invention.

Referring to FIG. 18A, after the bottom plate 120 is formed on the circuit board 110, the first conductive layer 121, the second conductive layer 125 and the third conductive layer 129 at predetermined positions are removed to form a plurality of openings, and thereafter the insulating material is filled in the openings, and a plurality of bottom support members 122 (e.g. oxide) are formed in the staircase area SA, as shown in the steps of FIGS. 1 to 3 and related contents thereof. In addition, a plurality of holes 180p may be formed in the staircase area SA. The holes 180p represent the predetermined positions of the vertical support members 180, For clear distinction, the cross-sections of the holes 180p are represented by a square, and the cross-sections of the bottom support members 122 are represented by a circle, but the shapes of holes 180p and bottom support members 122 are not limited thereto.

Figure 18B:
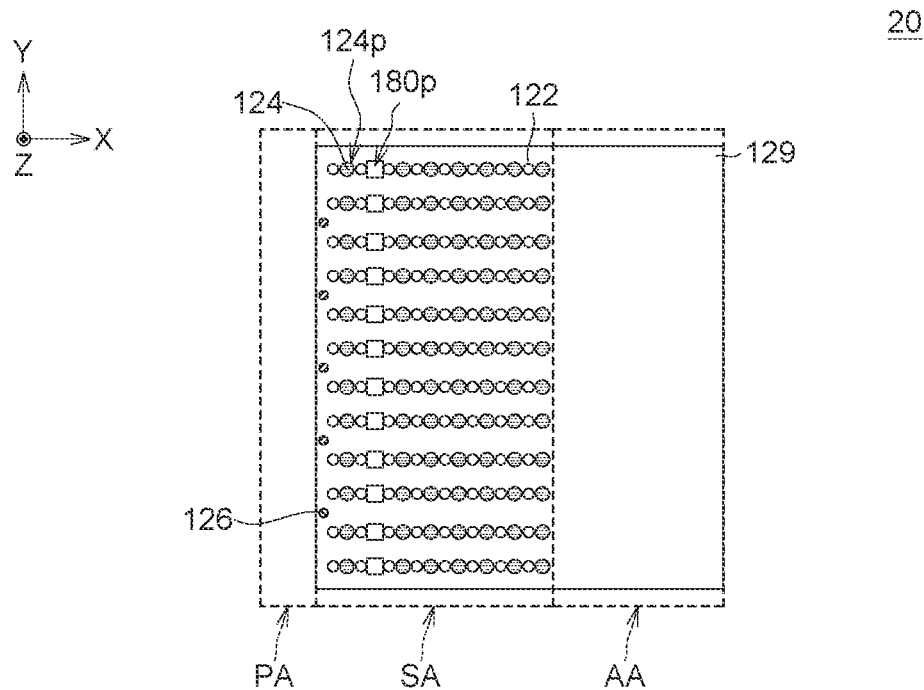

Referring to FIG. 18B, a plurality of landing pads 124 and a plurality of discharge pillars 126 are formed. The structures, functions and forming steps of the landing pads 124 and the discharge pillars 126 are shown in FIGS. 4 to 6 and related contents. Adjacent landing pads 124 are separated by the bottom support members 122. As shown in FIG. 18B, in the present embodiment, the discharge pillars 126 may be farther away from the array area AA than the landing pads 124.

Figure 18C:
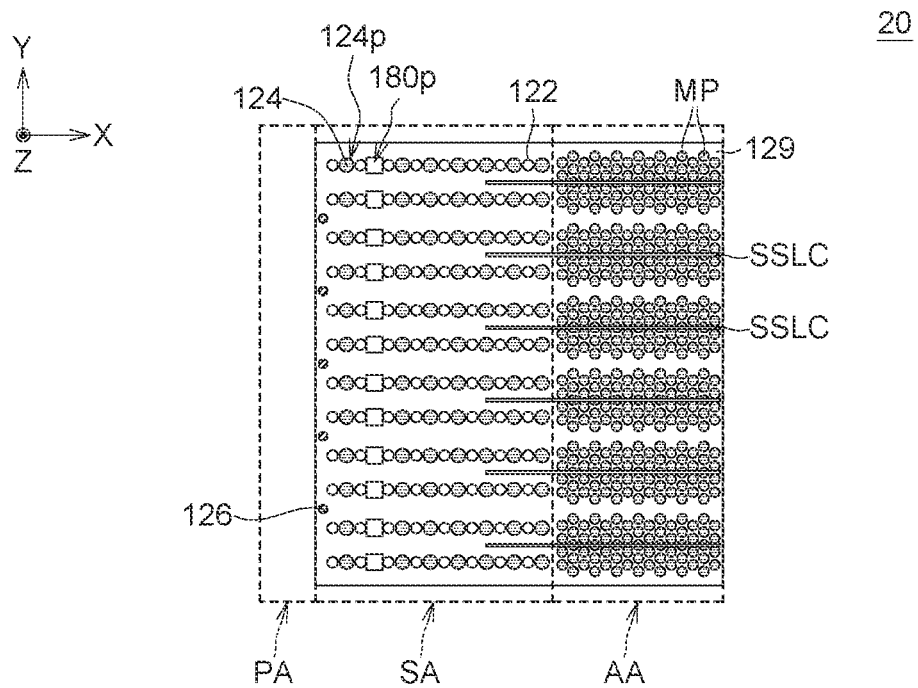

Referring to FIG. 18C, the memory pillars MP and the top isolating members SSLC are formed. The structures, functions and forming steps of the memory pillars MP and the top isolating members SSLC are shown in FIGS. 7A and 7B and related contents.

Figure 18D:
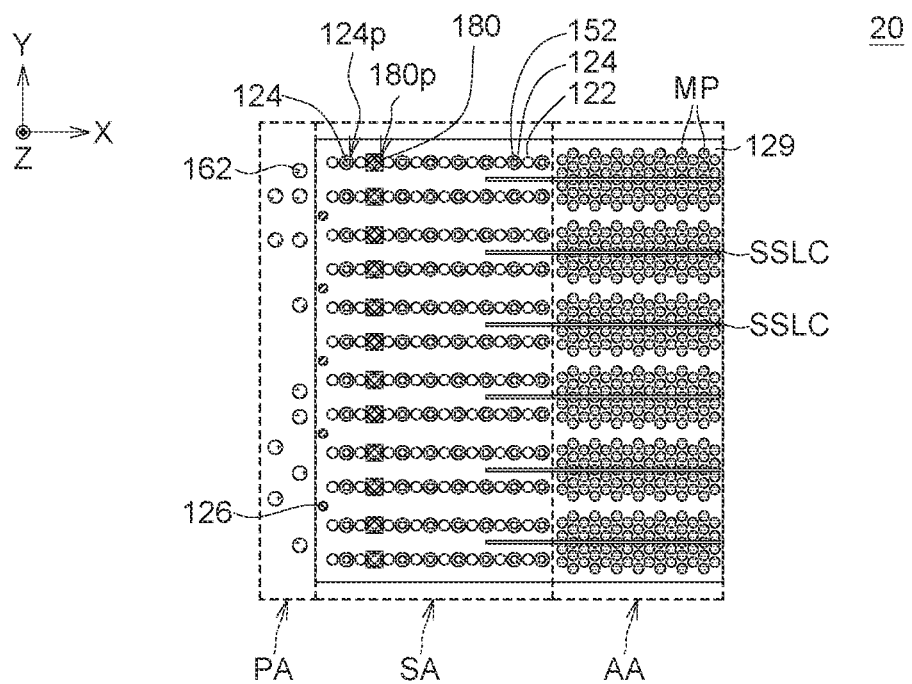

Referring to FIG. 18D, the support pillars 152, the vertical contacts 162 and vertical support members 180 are formed by the same process. The structures, functions and forming steps of the support Oars 152 and the vertical contacts 162 are shown in FIGS. 8A to 10B and related contents. The support pillars 152 in the staircase area SA are formed on the landing pads 124. The vertical contacts 162 pass through the bottom plate 120 along a first direction (e.g., Z direction) and extend to corresponding wires 116. The forming method and structure of the vertical support members 180 disposed in the staircase area SA are similar to the forming method and structure of the vertical contacts 162 disposed in the peripheral area PA. The vertical support members 180 disposed in the staircase area SA pass through the bottom plate 120 along the first direction (e.g., Z direction) and extend to the corresponding wires 116. The vertical support members 180 include third conductive pillars (not shown) and third liners (not shown) surrounding the third conductive pillars (not shown). In one example, the material of the third conductive pillars (not shown) is the same as the material of the first conductive pillars 1522 and the second conductive pillars 1622. The material of the third liners (not shown) is a dielectric material. In some examples, the material of the third liners (not shown) is the same as the material of the first liners 1521 and the second liners 1621. The third conductive pillars (not shown) are in electrical contact with the corresponding wires 116. The vertical contacts 162 in the peripheral area PA may have the function of signal transmission (e.g., signal transmission of word lines). The support pillars 152 in the staircase area SA have the function of supporting the entire structure during the gate replacement process. The vertical support members 180 in the staircase area SA not only have the function of signal transmission, but also have the function of supporting the entire structure in the gate replacement process.

Figure 18E:
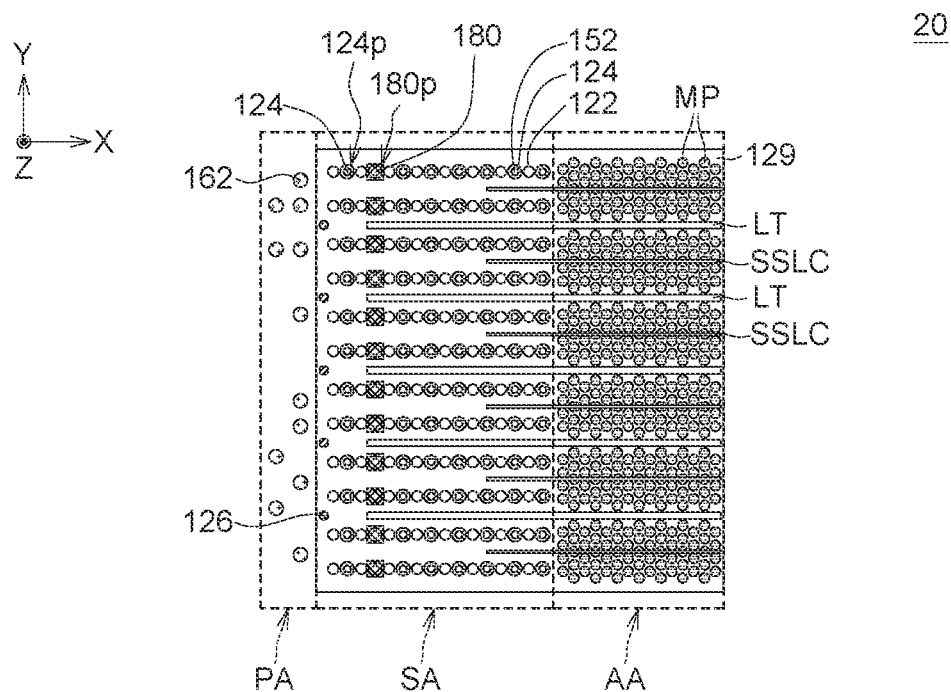

Referring to FIG. 18E, the trenches LT are formed and a gate replacement process is performed. The steps of forming the trenches LT and the gate replacement process are shown in FIGS. 11A to 16B and related contents. The trenches LT extend from the array area AA to the staircase area SA along the second direction (e.g., X direction).

Referring to Fla 18F, a plurality of extending contacts 174 are formed in the staircase area SA. Then, a back end of line process is performed. The forming methods of the back end of line process are shown in FIGS. 17A to 17B and related contents thereof.

Figure 18F:
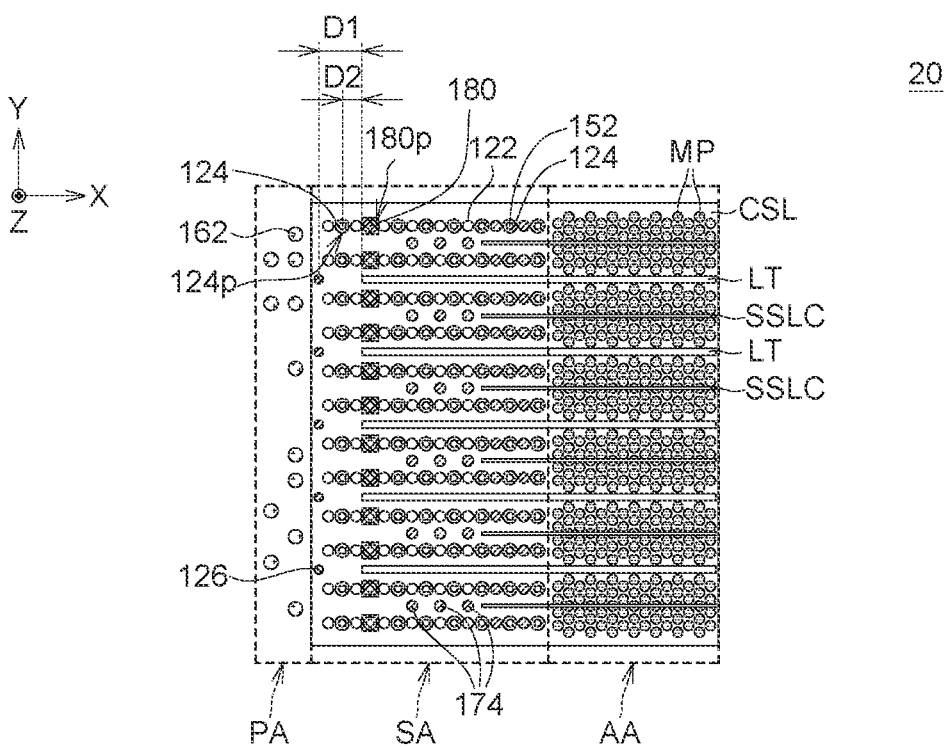

As shown in FIG. 18F, in the staircase area SA, the discharge pillars 126 are farther away from the trenches LT than the support pillars 152. For example, in the staircase area SA, there is a first distance D1 in the second direction (e.g., X direction) between an end of the trenches LT and a center point of the discharge pillars 126. There is a second distance D2 in the second direction (e.g., X direction) between an end of the trenches LT and a center point of the support pillars 152 (such as the support pillars 152 closest to the discharge pillars 126). The first distance D1 is greater than the second distance D2.

Figure 19:
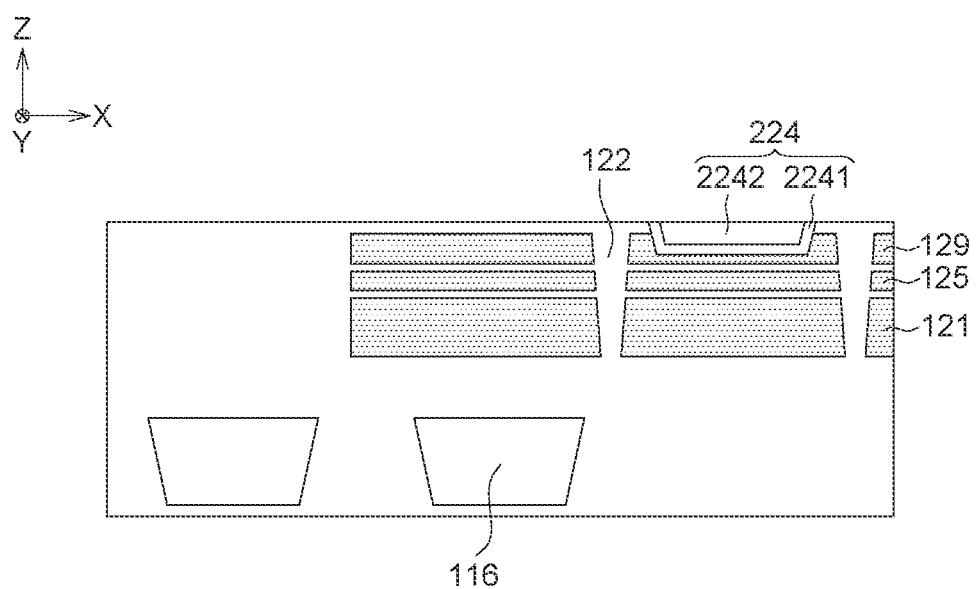
FIG. 19 shows a cross-sectional view of a landing pad according to a further embodiment of the present invention.
Figure 20A:
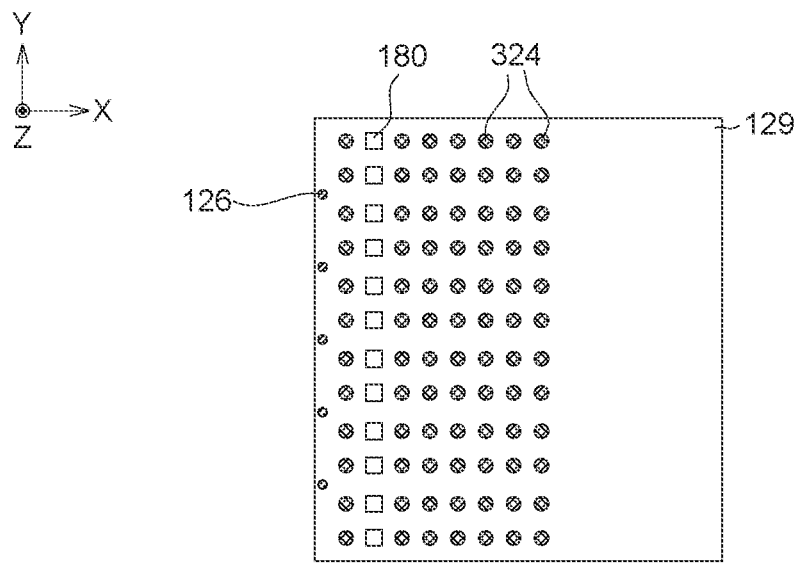
FIG. 20A shows a top view of a landing pad according to a further embodiment of the present invention.
Figure 20B:
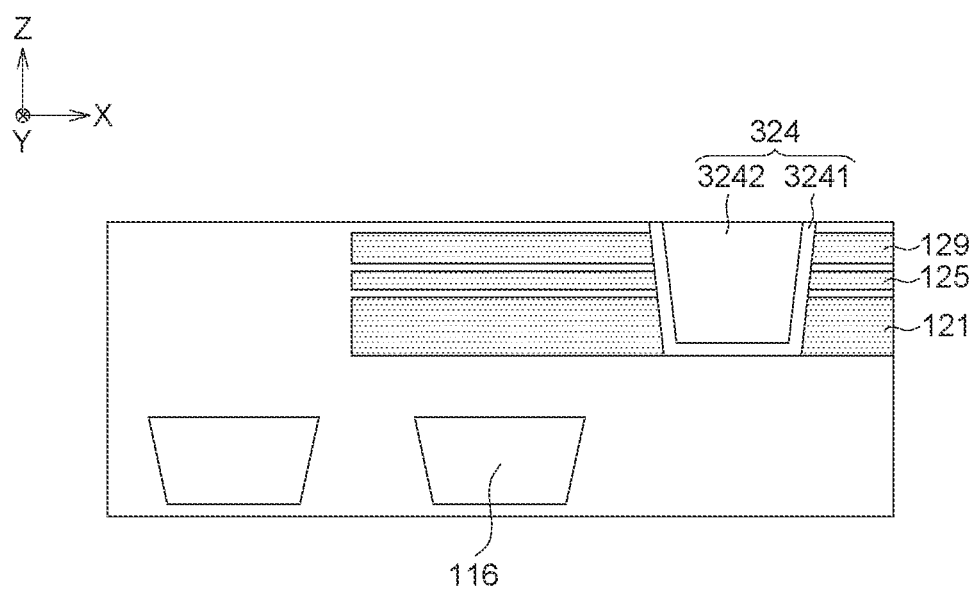
FIG. 20B shows a cross-sectional view of a landing pad according to a further embodiment of the present invention.

FIG. 19 shows a cross-sectional view of a landing pad 224 according to a further embodiment of the present invention. FIG. 20A shows a top view of a landing pad 324 according to a further embodiment of the present invention, and FIG. 20B shows a cross-sectional view of the landing pad 324 according to a further embodiment of the present invention. FIGS. 19 and 20B correspond to a plane formed by the first direction (e.g., Z direction) and the second direction (e.g., X direction). FIG. 20A corresponds to a plane formed by the second direction (e.g., X direction) and the third direction (e.g., Y direction).

Referring to FIG. 19, the difference between the landing pad 224 and the landing pad 124 shown in FIG. 6 is in that the landing pad 224 is a double-layered structure, including an insulating portion 2241 and a conductive portion 2242. The insulating portion 2241 covers the sidewall and bottom of the conductive portion 2242, and exposes an upper surface of the conductive portion 2242, so that the landing pad 224 is electrically isolated from the third conductive layer 129 disposed below (i.e., electrically isolated from the bottom conductive layer CSL formed in the following steps). In the present embodiment, the material of the insulating portion 2241 may include oxide, and the material of the conductive portion 2242 may include a conductive material, such as tungsten. The upper surface of the landing pad 224 is still made of conductive material, so it can provide a good etching selectivity as the landing pad 124. Furthermore, the insulating portion 2241 of the landing pad 224 has the advantage of reducing the RC delay of the bottom conductive layer CSL.

Referring to FIGS. 20A and 20B, the landing pad 324 includes an insulating portion 3241 and a conductive portion 3242. The material of the insulating portion 3241 may include oxide, and the material of the conductive portion 3242 may include a conductive material, such as tungsten. The difference between the landing pad 324 and the landing pad 224 is in that the landing pad 324 extends from the third conductive layer 129 downward to the first conductive layer 121, that is, the landing pad 324 can extend to the bottom of the bottom conductive layer CSL. In this way, the landing pad 324 can be used as support members in the process of forming the bottom conductive layer CSL (as shown in FIG. 12A and FIG. 12B), so the bottom support members 122 can be omitted. Similarly, the landing pads 324 can provide a good etching selectivity and have the advantage of reducing the RC delay of the bottom conductive layer CSL.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
   a circuit board, comprising a plurality of circuit structures and a plurality of wires, the circuit structures being electrically connected to corresponding wires, and the circuit board having a peripheral area, an array area, and a staircase area disposed between the peripheral area and the array area;
   a bottom plate, disposed over the circuit board, and the bottom plate comprising a bottom conductive layer;
   a plurality of landing pads embedded in at least a top portion of the bottom conductive layer and contacting the bottom conductive layer in the staircase area;
   a stack, disposed on the bottom plate, and the stack comprising a plurality of conductive layers and a plurality of insulating layers alternately stacked along a first direction;
   a plurality of support pillars, passing through the stack along the first direction and extending to the landing pads in the staircase area; and
   a plurality of memory pillars, passing through the stack along the first direction in the array area;
   wherein the bottom conductive layer comprises a plurality of top openings in a top portion of the bottom conductive layer in the staircase area, and the landing pads are formed within the top openings of the bottom conductive layer.

2. The semiconductor device according to claim 1, wherein the bottom conductive layer serves as a common source line.

3. The semiconductor device according to claim 1, wherein a distance between a bottom surface of the landing pads and a bottom surface of the bottom conductive layer in the staircase area in the first direction is smaller than a distance between a top surface of the bottom conductive layer and the bottom surface of the bottom conductive layer in the array area in the first direction.

4. The semiconductor device according to claim 1, further comprising a plurality of vertical contacts extending along the first direction in the peripheral area and in electrical contact with the corresponding wires, wherein the plurality of support pillars and the plurality of vertical contacts comprise a same conductive material.

5. The semiconductor device according to claim 1, wherein each of the plurality of landing pads has a conductive portion.

6. The semiconductor device according to claim 5, further comprising an insulating portion covering sidewalls and bottom of the conductive portion.

7. The semiconductor device according to claim 1, further comprising a plurality of discharge pillars passing through the bottom conductive layer along the first direction in the staircase area and in electrical contact with the corresponding wires.

8. The semiconductor device according to claim 7, wherein a top surface of the landing pads and a top surface of the discharge pillars are substantially coplanar.

9. The semiconductor device according to claim 7, further comprising at least one trench passing through the stack along the first direction and extending from the array area to the staircase area along a second direction, wherein the second direction is different from the first direction, wherein,
the discharge pillars are farther away from the at least one trench than the support pillars.

10. The semiconductor device according to claim 7, wherein the discharge pillars and the landing pads comprise a same conductive material.

11. The semiconductor device according to claim 1, further comprising a stacked structure, the stacked structure and the stack are disposed over the bottom plate side by side, wherein the stacked structure comprises a plurality of sacrificial layers connected to the plurality of conductive layers of the stack.

12. The semiconductor device according to claim 1, wherein each of the plurality of memory pillars comprises a memory layer and a channel layer, a portion of the memory layer covering a bottom surface of the channel layer of each of the memory pillars being embedded in the bottom conductive layer.

13. A method for manufacturing a semiconductor device, comprising:
forming a circuit board, the circuit board comprising a plurality of circuit structures and a plurality of wires, the circuit structures being electrically connected to corresponding wires, and the circuit board having a peripheral area, an array area, and a staircase area disposed between the peripheral area and the array area;
forming a bottom plate disposed over the circuit board, and the bottom plate comprising a bottom conductive layer;
forming a plurality of landing pads embedded in at least a top portion of the bottom conductive layer and contacting the bottom conductive layer in the staircase area;
forming a stack disposed on the bottom plate, and the stack comprising a plurality of conductive layers and a plurality of insulating layers alternately stacked along a first direction;
forming a plurality of support pillars passing through the stack along the first direction and extending to the landing pads in the staircase area; and
forming a plurality of memory pillars passing through the stack along the first direction in the array area;
wherein the method further comprises:
forming a plurality of top openings in the at least the top portion of the bottom conductive layer in the staircase area;
in forming the landing pads embedded in the at least the top portion of the bottom conductive layer and contacting the bottom conductive layer in the staircase area, the landing pads are formed within the top openings of the bottom conductive layer.

14. The method according to claim 13, wherein the step of forming the bottom plate further comprises:
sequentially forming a first conductive layer, a first insulating layer, a second conductive layer, a second insulating layer and a third conductive layer along the first direction on the circuit board.

15. The method according to claim 13, further comprising:
forming the plurality of top openings in the at least the top portion of the bottom conductive layer in the staircase area comprises forming top openings in a top portion of the third conductive layer in the staircase area; wherein the method further comprises filling a conductive material into the top openings of the third conductive layer to form the landing pads; wherein the top openings of the third conductive layer are separated from each other.

16. The method according to claim 14, wherein:
forming a plurality of through openings passing through the bottom plate to the corresponding wires in the staircase area; and
filling a conductive material into the plurality of through openings to form a plurality of discharge pillars.

17. The method according to claim 16, wherein a top surface of the landing pads and a top surface of the discharge pillars are substantially coplanar.

18. The method according to claim 13, wherein the support pillars comprise a conductive material.

19. The method according to claim 13, further comprising:
forming a plurality of vertical contacts extending along the first direction in the peripheral area and in electrical contact with the corresponding wires, wherein the plurality of support pillars and the plurality of vertical contacts comprise a same conductive material.

20. The method according to claim 13, wherein each of the plurality of landing pads has a conductive portion and an insulation portion covering sidewalls and bottom of the conductive portion.

* * * * *